United States Patent
Yamanaka et al.

(12) 
(10) Patent No.: US 6,407,420 B1
(45) Date of Patent: Jun. 18, 2002

(54) INTEGRATED CIRCUIT DEVICE HAVING LINE WIDTH DETERMINED BY SIDE WALL SPACER PROVIDED IN OPENINGS FORMED IN INSULATING FILM FOR CONNECTION CONDUCTORS

(75) Inventors: Toshiaki Yamanaka, Iruma; Shin'ichiro Kimura, Kunitachi; Hideyuki Matsuoka, Hoya; Tomonori Sekiguchi, Kokubunji; Takeshi Sakata, Kodaira; Kiyoo Itoh, Higashikurume, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/331,149

(22) PCT Filed: Dec. 20, 1996

(86) PCT No.: PCT/JP96/03736

§ 371 (c)(1),
(2), (4) Date: Jun. 17, 1999

(87) PCT Pub. No.: WO98/28795

PCT Pub. Date: Jul. 2, 1998

(51) Int. Cl.[7] .................. H01L 27/108; H01L 29/76; H01L 29/94; H01L 31/119
(52) U.S. Cl. ............... 257/296; 257/303; 257/306
(58) Field of Search .................. 257/296, 303, 257/306, 307, 308, 309, 906, 907, 908; 438/244, 253, 387, 396

(56) References Cited

U.S. PATENT DOCUMENTS 6,103,566 A * 8/2000 Tamaru et al. .............. 438/240

FOREIGN PATENT DOCUMENTS

| JP | 62-48062 | 3/1987 |
|---|---|---|
| JP | 62-128168 | 6/1987 |
| JP | 3-263371 | 11/1991 |
| JP | 5-299601 | 11/1993 |
| JP | 6-45552 | 2/1994 |
| JP | 6-151751 | 5/1994 |
| JP | 7-142597 | 6/1995 |
| JP | 8-46152 | 2/1996 |
| JP | 8-181290 | 7/1996 |

OTHER PUBLICATIONS

IEEE Int., Electron Devices Meeting, Technical Digest, Dec. 1994, pp. 927–929.

* cited by examiner

Primary Examiner—Olik Chaudhuri
Assistant Examiner—Hoai Pham
(74) Attorney, Agent, or Firm—Mattingly, Stanger & Malur, P.C.

(57) ABSTRACT

According to the present invention, an overlay margin is secured for matching a wiring electrode 11 with a storage electrode 15 of a capacitor at their point of contact and the required area for a memory cell can be decreased by placing the plug electrode 11 of titanium nitride in the active region of a semiconductor substrate or over the gate electrode, reducing the size of the opening for passing the storage electrode 15 of the capacitor of a stacked structure, and decreasing the line width of a wiring electrode 13. By the common use of the above-mentioned plug electrodes in a CMISFET region in the peripheral circuit and in a memory cell of a static RAM, their circuit layouts can be made compact.

17 Claims, 32 Drawing Sheets

INTEGRATED CIRCUIT DEVICE HAVING LINE WIDTH DETERMINED BY SIDE WALL SPACER PROVIDED IN OPENINGS FORMED IN INSULATING FILM FOR CONNECTION CONDUCTORS

TECHNICAL FIELD

The present invention relates to a semiconductor memory device, such as a dynamic random access memory having a capacitor of a three-dimensional structure suitable for high density device integration or to a static random access memory, and also to an embedded memory system LSI using those memory elements as cores.

BACKGROUND ART

For example, the dynamic random access memory (hereafter referred to as a dynamic RAM) has as an elemental memory unit a memory cell having connected thereto a capacitor to store electric charge as one bit of information and a switch transistor to write or read information into or from the capacitor. As it forms one memory cell by the small number of component elements as described above, the dynamic RAM is widely used in the main memory of computer equipment that requires a large capacity.

To increase the memory capacity of the dynamic RAM, it is necessary to miniaturize the memory cell area to increase the density of the memory cells.

However, in such a process, by the reduction of the memory cell area, the effective area of the charge-storage capacitor of the memory cell is decreased and the storage capacitance decreases. Therefore, the so-called soft-error phenomenon has manifested itself that information in the memory cell is reversed by a decrease of S/N ratio or by alpha-ray exposure, and has become a serious problem of reliability.

For this reason, there have been devised several memory cell structures that provide a large storage capacitance without increasing the area occupied by the memory cell. One of them is a memory cell having a stacked capacitor formed as a three-dimensional capacitor that uses the vertical material faces of the storage capacitance electrode as in the crown-shaped capacitor. Memory cells of this kind are described in JP-A-62-48062 and JP-A-62-128168, for example.

The memory cell of a 1-gigabit dynamic RAM is discussed in IEEE Int., Electron Devices Meeting, Technical Digest, pp.927–929 December (1994).

The dynamic RAM that the present inventors have conceived based on the memory cell structure disclosed in the above-mentioned literature is shown in FIG. 45. The structure and problem of this dynamic RAM will be described with reference to FIG. 45.

In FIG. 45, a transistor as a switch for the memory cell (hereafter a MISFET, which is in most general use, is used) includes a gate insulator 403, a gate electrode 404 and highly-doped n-type impurity regions 407, 408 as the source or the drain. In the highly-doped n-type impurity regions 407, 408, there are polycrystalline-silicon plugs 410 that pierce through a silicon dioxide film 409. There is an opening through a insulating film 412 on the polysilicon plug 410. Through this polysilicon plug, a data line (wiring electrode 413) formed on the insulating film 412 is electrically connected to the highly-doped n-type impurity region 407. In a space between the data line (wiring electrode 413) and a word lines (gate electrodes 404), there is formed a common opening, which runs through the insulating film 412 on the polysilicon plug 410 in the highly-doped n-type impurity region 408 and a silicon dioxide film 414 on the insulating film 412. Through this opening and the polysilicon plug 410, a storage electrode 415 of a crown-shaped capacitor formed of the above-mentioned polysilicon is electrically connected to the highly-doped n-type impurity region 408.

A capacitor dielectric film 416 is deposited on the storage electrode 415, and a plate electrode 417 is provided on the capacitor dielectric film 416. An aluminum wiring 419, formed on the silicon dioxide film 418 on the memory cell, is used as the cell selection wire or the main word line.

However, in a memory cell that has a capacitor above the data line as mentioned above, particularly, in the same memory cell when it is used for high device integration, the connection point of the data line (wiring electrode 413) and that of the capacitor electrode 415 are inevitably arranged very close to each other. Therefore, it becomes difficult to secure sufficient electrical insulation between the data line and the capacitor electrode due to mask misalignment during manufacture or a shift in dimensions (side etching) in dry etching in forming the opening of the insulating film 414. There is another problem. In matching of the data line to the opening of the insulating film 412, it becomes difficult to secure a sufficient allowance of the data line to overlie the opening. Owing to mask misalignment or a dimensional shift (side etching) in the dry etching of the wiring electrode 413 as the data line, there os a possibility that the polysilicon plug 410 is exposed from the above-mentioned opening and etched deeper.

Further, it has been necessary to arrange peripheral circuits, such as sense amplifiers, which are directly connected to the memory cell array, at the same pitch as the memory cells or at a twice larger pitch. In a memory for high device integration, which has a small area, it has been necessary to reduce the area occupied by the direct peripheral circuits, such as the sense amplifiers. Also in the indirect peripheral circuit, there are the same problems as with the memory cell as mentioned above in reducing the area occupied by the MISFET as a component part of the indirect peripheral circuit and in improving the wiring density.

Further, because a three-dimensional capacitor with a considerable height is used for the memory cell, if such a height difference between the memory cell portion and the indirect peripheral circuit portion is smoothed out, a problem has arisen that the depth of the contact holes in the indirect peripheral circuit portion increases and disconnection occurs in the indirect peripheral circuit.

To solve this problem, it is effective to use polysilicon plugs the same as used for the memory cells also for the contact areas of the indirect peripheral circuit. Doped polysilicon has conventionally been used to form polysilicon plugs, and therefore polysilicon plugs of doped polysilicon could be used for memory cells comprising transistors of one conductivity type.

However, in the indirect peripheral circuit where transistors of different conductivity types are generally used, polysilicon plugs of doped polysilicon of one conductivity type could not be used and therefore it has been difficult to reduce the areas of the indirect peripheral circuits.

On the other hand, as a plug material such as mentioned above, tungsten is well known which is deposited by chemical vapour deposition (CVD). In this case, tungsten can be used for the indirect peripheral circuit because tungsten serves as the diffusion barrier against impurities, but a problem has presented itself that tungsten has a low heat resistance and reacts with silicon during heat treatment at 600° C. or higher.

Also in a static random access memory (hereafter referred to simply as a static RAM) cell made of transistors of opposite conductivity types formed on the principal surface of the silicon substrate, the memory cell area could be reduced by local interconnect technology. But, with technologies of this kind, it has not become possible to install the wiring layers of the indirect peripheral circuit.

Further, in an embedded memory system LSI (semiconductor integrated circuit system) using high-density dynamic, it is essential to use as many parts common to the memory cell and logic regions as possible.

DISCLOSURE OF THE INVENTION

An object of the present invention is to provide a semiconductor memory device, which includes a memory cell and indirect peripheral circuit and which has high component integration and high reliability.

Another object of the present invention is to provide a semiconductor memory device, which includes a memory cell and complementary transistors that form a sense amplifier or a logic circuit, and which has high component integration and high reliability.

Yet another object of the present invention is to provide a dynamic RAM having stacked capacitors in high density and with increased storage capacity.

A still further object of the present invention is to provide a dynamic RAM with a reduced memory cell area.

The present invention has been made to provide a semiconductor memory device which enables cost reduction by simplifying the manufacturing process.

According to the present invention, a semiconductor memory device having a memory cell and its indirect peripheral circuit, comprising:

transistors provided on a principal surface of a semiconductor surface;

a first insulating film provided on the transistors;

a plurality of first conductors (plug electrodes) passing through the first insulating film and being made of titanium nitride having superior covering properties; and a first wiring provided on the principal surface of the first insulating film,
wherein the first wiring is connected to the transistors by the first conductors.

According to the present invention, in a memory cell region, a capacitor and a transistor formed on a principal surface of a second insulating film on the first insulating film are connected by the second conductor that pass through the first conductor and the second insulating film.

According to the present invention, the second conductor is formed so that its cylindrical portion is smaller than the diameter of the cylindrical portion of the first conductor.

Further according to the present invention, the first wiring is formed so that its line width is thinner than the diameter of the cylindrical portion of the first conductor.

Still further according to the present invention, a n-channel transistor and a p-channel transistor, which constitute a complementary transistor, are electrically connected by the first conductor.

According to the present invention, the first conductor made of titanium nitride effectively functions as the etching stopper to dry etching of the first wiring by using a suitable material for the first wiring and thus effectively utilizing a difference in etching rate between the first conductor and the first wiring.

Therefore, even if the first wiring connected to the first conductor is arranged in such a way that the first wiring does not completely cover the first conductor exposed at the principal surface of the first insulating film, the first conductor is prevented from being etched deeper when the first wiring is dry etched.

Because the diameter of the cylindrical portion of the second conductor and the line width of the first wiring are both thin, a contact does not occur between the second conductor and the first wiring.

Therefore, even if the area for the memory cell is reduced, a short-circuit never occurs between the capacitor and the data line, and because the capacitor is located above the data line, the required area for the capacitor in the memory cell can be increased to a maximum.

Further, because the titanium nitride serves as the barrier to diffusion of impurities, the first conductor is used to connect the n-channel transistor and the p-channel transistor in indirect peripheral circuit devices or in a static RAM cell formed by complementary transistors, so that the required areas for the indirect peripheral circuit and a memory cell can be reduced.

BEST MODE OF CARRYING OUT THE INVENTION

The present invention will be described in detail with reference to preferred embodiments.

Embodiment 1

Figure 1:
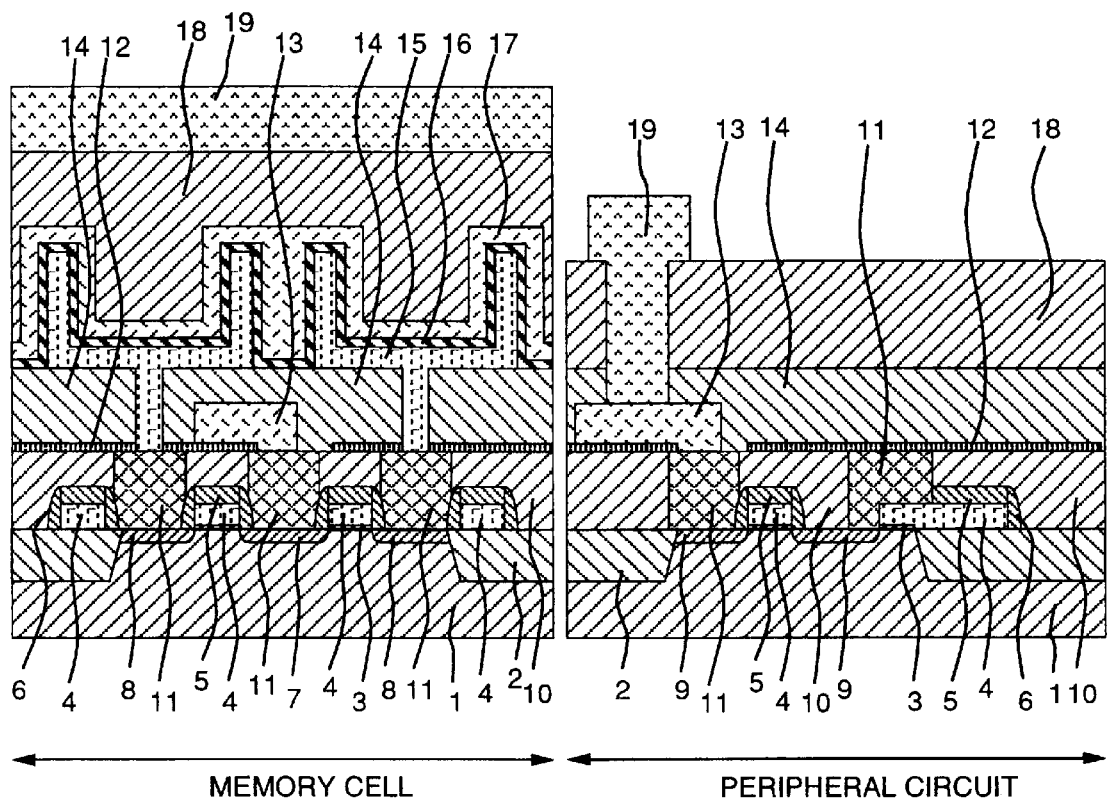
FIG. 1 is a sectional view of a semiconductor memory device according to a first embodiment of the present invention.
Figure 2:
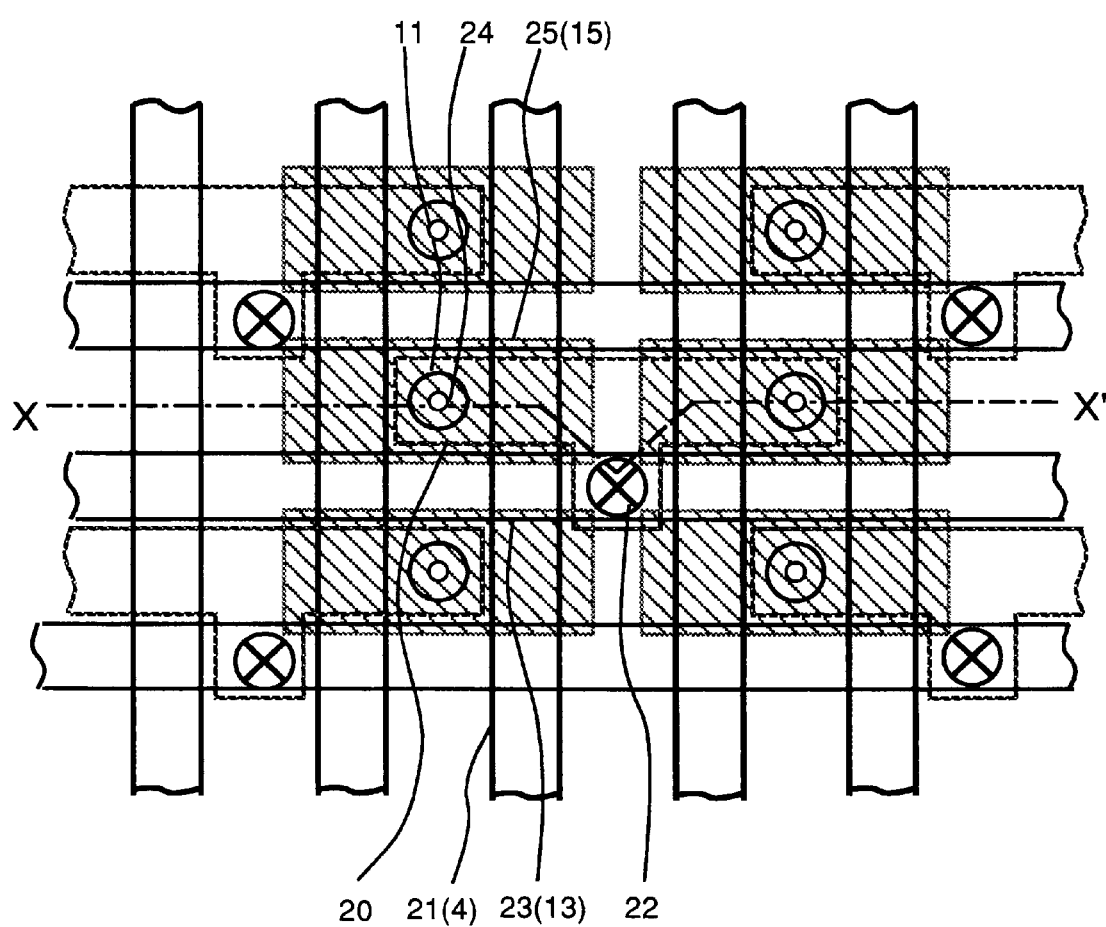
FIG. 2 is a plan view of the semiconductor memory device according to the first embodiment of the present invention.

Referring to FIGS. 1 to 10, description will be made of an embodiment of a dynamic RAM according to the present invention. FIG. 1 shows a sectional view of the memory cell and a sectional view of the MISFET portion of the indirect peripheral circuit depicted together the same drawing. FIG. 2 is a plan view of the memory cell. The sectional view of the memory cell portion in FIG. 1 corresponds to a part of the cross section taken along the line X–X' in FIG. 2.

In FIG. 1, a MISFET in the memory cell consists of a gate insulating film 3, a gate electrode 4, and highly-doped n-type impurity regions 7, 8 as the source and drain. A MISFET in the indirect peripheral circuit consists of a gate insulating film 3, highly-doped p-type impurity regions 9 as the source and drain. Generally, a complementary MISFET (a CMIS-FET or more specifically a CMOSFET) is used in the indirect peripheral circuit. In the present invention, too, description presupposes the use of n-channel and p-channel transistors as the indirect peripheral circuit elements. However, description is limited to the p-channel transistor.

Plug electrodes 11 made of titanium nitride are used both in the highly-doped n-type impurity regions 7, 8 and in the highly-doped p-type impurity regions 9. The plug electrode on the highly-doped n-type impurity region 7 of the memory cell is connected to a wiring electrode 13 as the data line. A storage electrode (bottom electrode) 15 of a crown-shaped capacitor is provided above the data line 13. The storage electrode 15 is connected to the plug electrode 11 on the highly-doped n-type impurity region 8, and is electrically connected to the MISFET. In the silicon dioxide film 14 as the inter-layer dielectric, there is formed an opening that is smaller than in diameter than the plug electrode 11, and the storage electrode 15 is connected to the plug electrode 11 through this opening. A capacitor dielectric film 16 is deposited on the storage electrode 15, and a plate electrode 17 of the capacitor is provided on top of the capacitor dielectric film 16, thus forming the crown-shaped capacitor.

On the other hand, the plug electrodes 11 are formed on the highly-doped p-type impurity regions 9 as the source and drain of the MISFET and also on the gate electrode 4. As shown in FIG. 1, common plug electrodes 11 can be provided similarly for the gate electrode 4 and the highly-doped p-type impurity region 9. As mentioned earlier, the MISFET may be of the n-channel type or of the p-channel type, and the gate electrode may be of n-type or p-type conductivity. Moreover, the wiring electrode 13 may be connected to the plug electrodes of the indirect peripheral circuit to use as wiring of the indirect peripheral circuit.

Referring to the plan view of the memory cell in FIG. 2, the planar positional relationship of the MISFET and the capacitor in the memory cell will be described. In FIG. 2, the word line 21 is formed by a common gate electrode 4 (FIG. 1) of the MISFETs, and the data line 23 is formed by the wiring electrode 13 (FIG. 1). The word lines are laid in the Y-direction and the data lines are laid in the X-direction, and the crown-shaped capacitors 25 (storage electrodes 15) are formed above the word lines and the data lines. The capacitor 25 is connected through an opening 24 to the plug electrode 11 in the active region (T-region) in the space between the word line and the data line. It is not necessary to provide the data line 23 with an overlay margin with respect to the opening 22. Therefore, the data line 23 is made in a so-called dog-bone free structure as shown in FIG. 2.

Figure 3:
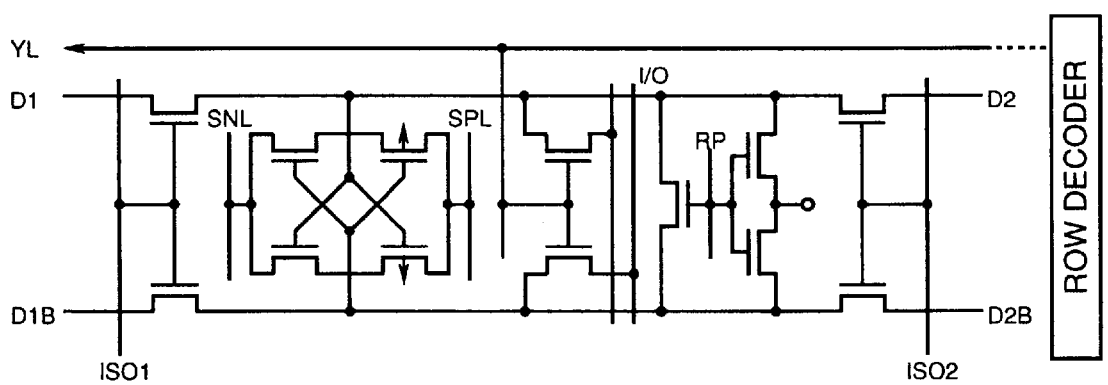
FIG. 3 is an equivalent circuit diagram of the semiconductor memory device according to the first embodiment of the present invention.

The above-mentioned dog-bone free structure can be applied in exactly the same way to the indirect peripheral circuit. For example, FIG. 3 shows a latch-type sense amplifier, but the present invention as shown in FIG. 1 can be effectively applied to a flip-flop circuit, such as is formed by having a pair of CMISFETs as inverters in the sense amplifier arranged (Lin cross connection. The above-mentioned sense amplifier in FIG. 1 shows the repetition unit, and the data pair lines connected to the adjacent memory cell are divided into data pair lines D1 and D1B and data pair lines D2 and D2B. A data-pair-line select line ISO1 or ISO2 separates the lines of each pair. The above-mentioned flip-flop circuit is connected to the data pair lines, and a signal sensed by the data line is amplified by driving the common source line SNL to ground potential and SPL to the power supply voltage. Switch transistors connected to the I/O signal lines are further connected to the data pair lines, and a row select line YL controls input and output of a signal.

The first embodiment of the present invention will be described in greater detail by referring to the sectional views of the manufacturing process in FIGS. 4 to 10. FIGS. 4 to 10 show the memory cell region and the indirect peripheral circuit region depicted together in the same drawing as in FIG. 1.

Figure 4:
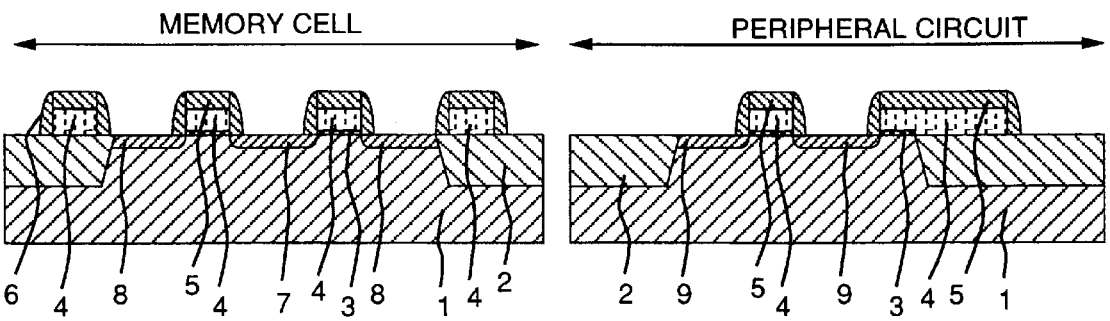
FIGS. 4 to 10 are sectional views for explaining the manufacturing process of the semiconductor memory device according to the first embodiment of the present invention.

As shown in FIG. 4, an isolation (field oxide film) 2 is selectively formed in a silicon substrate 1 having a crystal plane (100) by a well-known technique. In the active regions demarcated by the isolation 2, MISFETs, each having a gate electrode 4 and highly-doped n-type impurity regions 7, 8 or highly-doped p-type impurity regions 9, are formed by well-known methods. The gate of the MISFETs is 0.2 $\mu$m in length. In the formation of the isolation, various method may be used, such as a selective oxidation method (LOCOS) or trench isolation that has a silicon dioxide film entrenched in a shallow groove of a silicon substrate. In this case, n-channel MISFETs are used, but p-channel types may be used. Furthermore, a LDD (Lightly Doped Drain) structure may be used to reduce the device deterioration by hot carriers. To use self-aligned contact to the gate in order to avoid a formation of gate to contact short circuit by dry etching, silicon nitride films 5, 6 are provided at the top or to the sidewalls of the gate electrode 4 by a well-known method as shown in FIG. 4.

Figure 5:
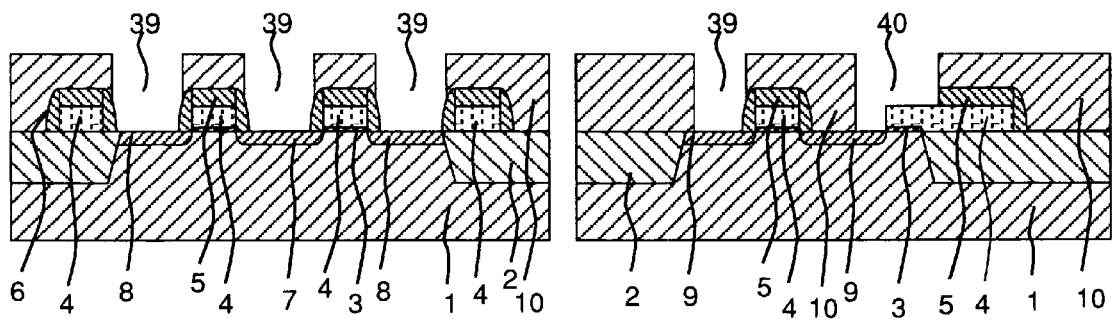

Subsequently, as shown in FIG. 5, a silicon dioxide film 10 containing boron and phosphorus is deposited by a well-known CVD method, and the surface of the silicon dioxide film 10 is smoothened by annealing at a temperature of about 800° C. The silicon dioxide film may be flattened by a method such as a well-known CMP (Chemical Mechanical Polishing). Then, openings 39, 40 about 0.2 $\mu$m in diameter are formed in the silicon dioxide film 10 by photolithography and dry etching of the silicon dioxide film. In this step, photolithography using excimer laser is carried out. In dry etching, it is preferable to form a silicon nitride film serving as the etching stopper at the lower portion of the silicon dioxide film 10 and form the openings by self-alignment to the isolation region. Preferably, the opening 40 that includes the portion where there is the gate electrode should be formed by photolithography and dry etching, which are performed separately from the similar processes mentioned above. Note that when the etching stopper mentioned above is used, dry etching should be carried out both on the silicon dioxide film and the silicon nitride film.

Figure 6:
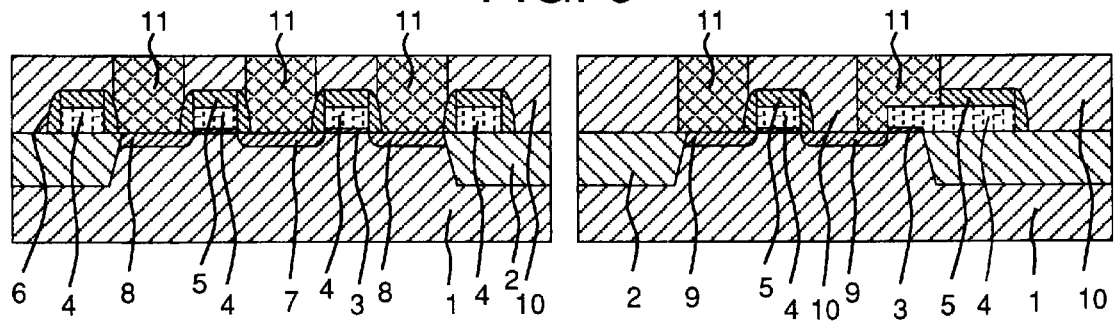

After this, as shown in FIG. 6, a titanium nitride (TiN) film is deposited to a thickness of about 300 nm by a well-known CVD technique, and the titanium nitride is etched back by anisotropic dry etching, and plug electrodes (titanium nitride:TiN) 11 are formed in the above-mentioned openings 39, 40. In this case, it is possible to simultaneously flatten the surface and form plug electrodes by polishing the titanium nitride film and the silicon dioxide film 10. Besides titanium nitride, a heat-resistant barrier material, such as titanium-tungsten (W) may be used.

Figure 7:
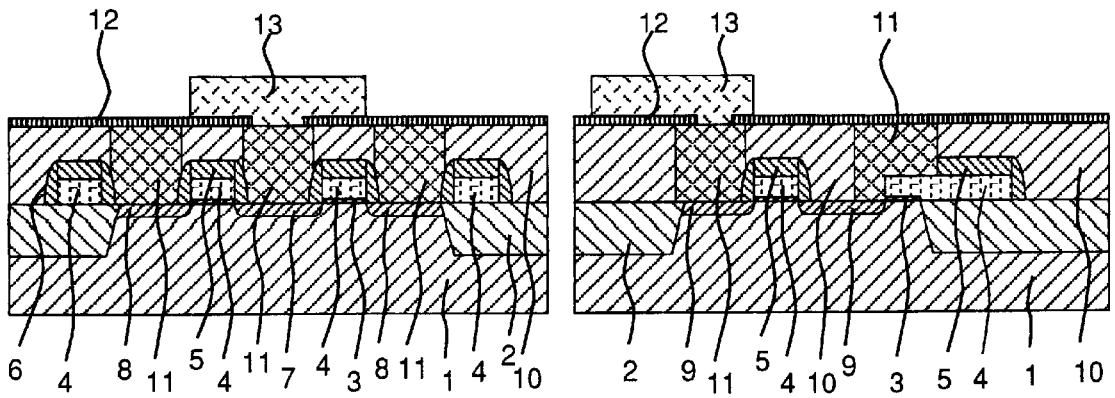

Subsequently, as shown in FIG. 7, a silicon nitride film 12 with a thickness of about 50 nm is deposited by a LPCV process, openings 22 (FIG. 2) are formed by photolithography and dry etching, tungsten is deposited to a thickness of about 100 nm as the wiring electrodes 13 and the deposited tungsten is patterned by photolithography and dry etching. Incidentally, as a material for the wiring electrodes 13, a high refractory metal other than tungsten or, for example, a composite film of a silicide film, which is a high refractory metal, and a polysilicon film can be used.

Figure 8:
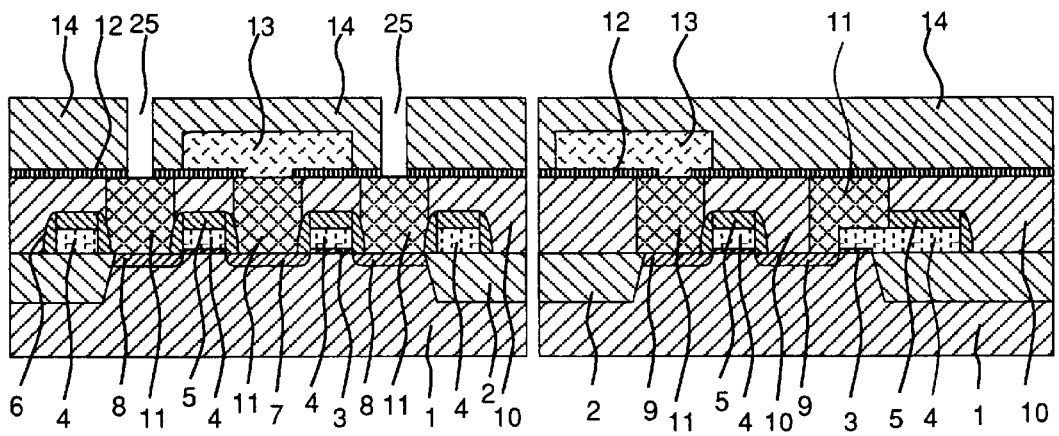

After this, as shown in FIG. 8, a silicon dioxide film 14 with a thickness of about 0.5 to 1 $\mu$m is deposited at a temperature of about 400° C. by a well-known CVD process using TEOS (tetra-ethyl-ortho-silicate) gas, and the surface is flattened by a well-known CMP method. Subsequently, openings 25 are formed in the silicon dioxide film 14 and the silicon nitride film 12. The diameter of the openings is about 0.1 $\mu$m.

Figure 9:
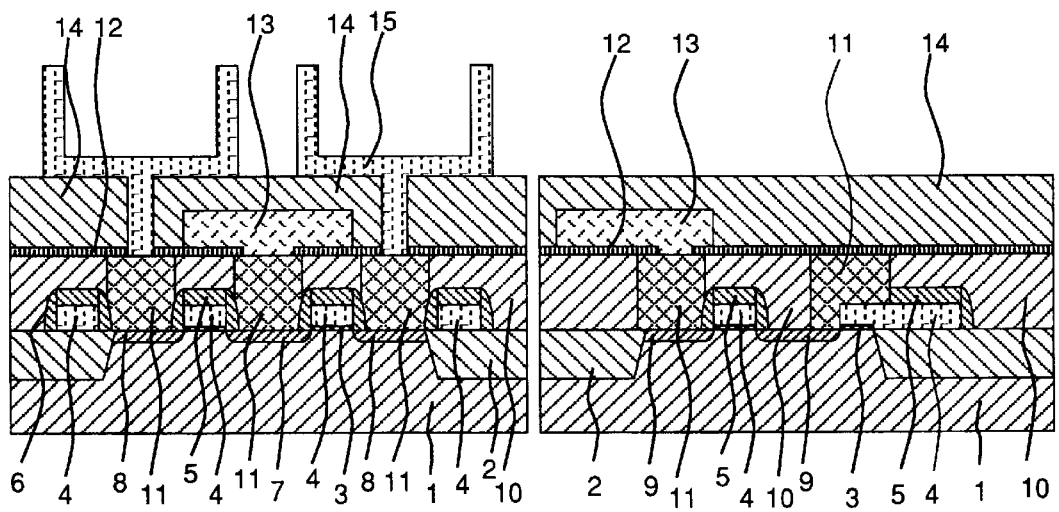

As shown in FIG. 9, a first polysilicon film highly doped with n-type impurities is deposited (not shown) to a thickness of about 100 nm by a well-known LPCVD method. In this case, this polysilicon film is embedded in the openings 25. Though not shown, a silicon dioxide film with a thickness of about 500 nm is deposited and is patterned by photolithography and dry etching to form the storage electrodes. After this, a second polysilicon film is deposited with better step coverage by LPCVD, and by etching the first and second polysilicon films by anisotropic dry etching and removing the silicon dioxide film about 500 nm thick mentioned above, crown-shaped storage electrodes 15 are formed. Note that before removing the silicon dioxide film mentioned above, it is desirable to have a silicon nitride film provided at a bottom layer of the silicon dioxide film.

Figure 10:
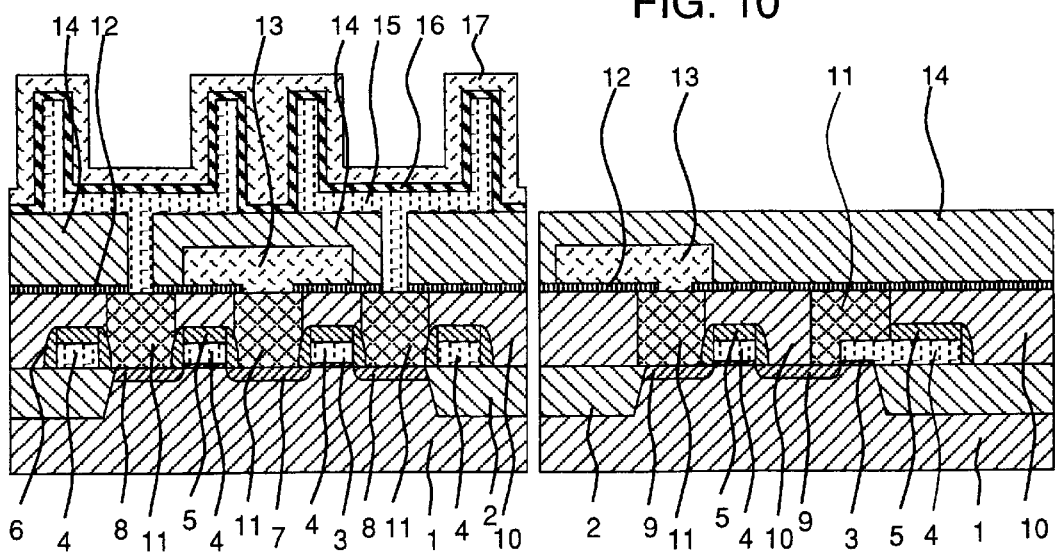

After this, as shown in FIG. 10, a capacitor dielectric film 16, such as tantalum pentoxide ($Ta_2O_5$) film is deposited, which has a greater dielectric constant than the silicon dioxide film. In this case, a CVD process for better step coverage is used as a deposition method. The effective oxide thickness of the capacitor dielectric film should preferably be 3 nm or less for a large-capacity dynamic RAM of 1-giga-bit class. Incidentally, here the polysilicon film is used for the storage electrodes 15, but a high refractory metal film, such as tungsten or titanium nitride, may be used. In this case, the effects of the natural oxide on the surface of the polysilicon film can be avoided, and the effective oxide thickness of the capacitor dielectric film can be decreased. As the material for the capacitor dielectric film, it is possible to use well-known high $\epsilon$ dielectrics such as a $SrTiO_3$ film and a (Ba, Sr) $TiO_3$ film (BST film) or a ferro-electric film in addition to a composite film of silicon nitride and a silicon dioxide film. After this, a high refractory metal film, such as tungsten or titanium nitride, is deposited to a thickness as large as 300 nm and is processed by photolithography and dry etching to form a capacitor plate electrode 17 (top electrode). As the method for depositing a material for the plate electrode, a CVD method for better step coverage should preferably be used.

Next, as the inter-layer insulating film, a silicon dioxide film 18 about 200 nm thick is deposited, openings are formed in the silicon dioxide films 14, 18 above the metal wiring 13, and after this, a metal wiring 19 is formed, thus completing a semiconductor device according to the present invention. A low resistivity metal such as aluminum is preferred for the metal wiring 19, and and may be used for wiring inside of a memory array as shown in FIG. 1. Further, a well-known plug technology or CMP method may be used to flatten the inter-layer dielectric when forming the metal wiring 21.

It ought to be noted that a greater storage capacity can be obtained by making undulated the surface area of the polysilicon storage electrode 15 in the first embodiment to increase its surface area. In the first embodiment, titanium nitride is used for the plug electrodes, but titanium-tungsten (TiW) may be used, or another material that is slower in etching rate in dry etching of the wiring electrode 13 and that serves as a barrier to impurity diffusion may be used.

Figure 44:
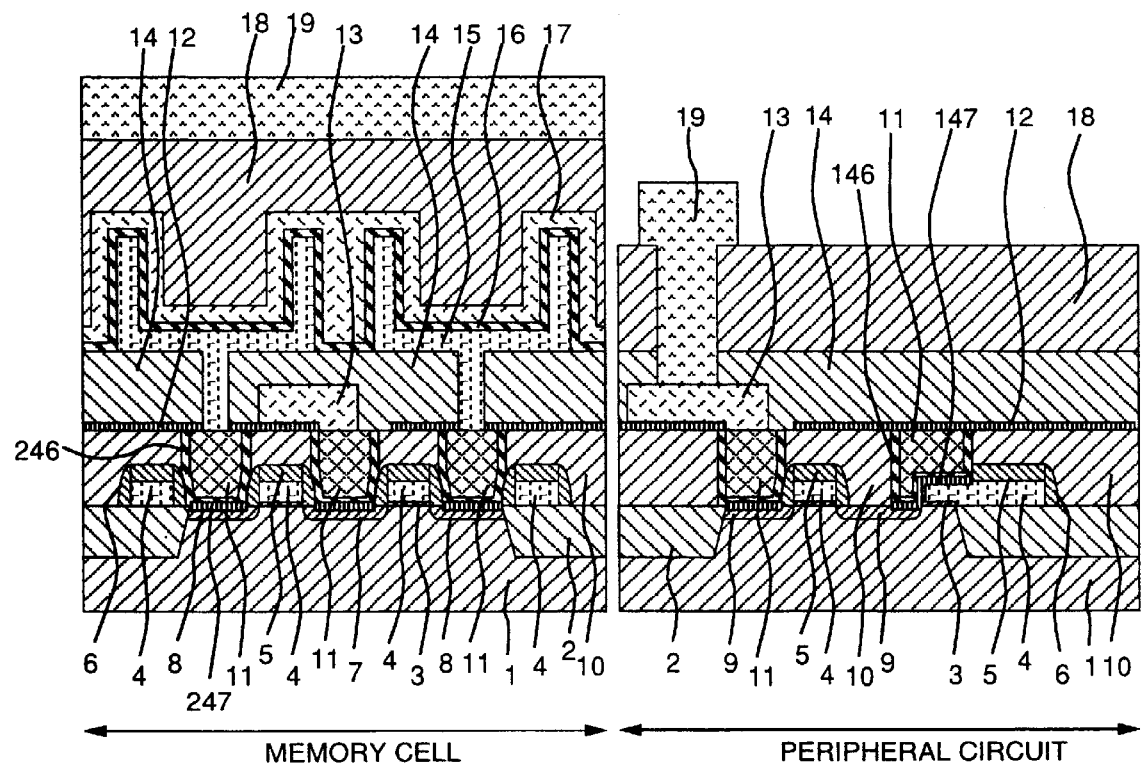
FIG. 44 is a sectional view of the semiconductor memory device according to the first embodiment of the present invention.

Further, as shown in FIG. 44, if titanium (Ti) 146 is provided at the underside of the plug electrodes 11 and titanium silicide ($TiSi_2$) 147 is formed at the interface the titanium and the silicon substrate, it is possible to prevent an increase in contact resistance with the highly-doped impurity regions 7, 8 and 9.

Figure 45:
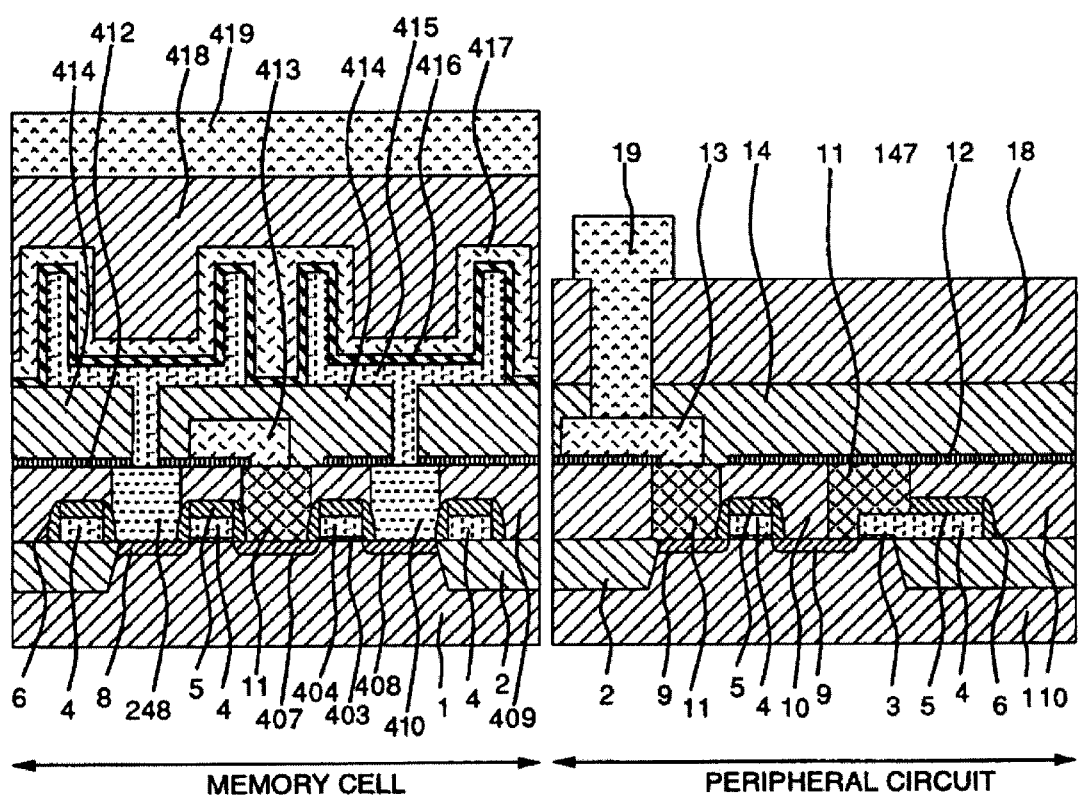
FIG. 45 is a sectional view of the semiconductor memory device according to the first embodiment of the present invention.

Further, as shown in FIG. 45, polysilicon plugs 248 may be placed on the highly-doped impurity regions 8 at the storage nodes at which the capacitors are connected. In this case, because the titanium nitride or titanium silicide does not directly contact the highly-doped impurity regions at the storage nodes, the junction leakage current can be reduced.

According to the first embodiment, because the plug electrodes 11, which connect the data lines to the highly-doped n-type impurity regions of titanium nitride, are made of titanium nitride, even if the plug electrode lying underneath the data line is exposed during etching the data line material, the plug electrode is not etched, so that the overlay margin for openings for connection between datalines can be reduced.

Further, the storage electrode of the capacitor is not directly connected to the silicon substrate but connected through the intermediary of the plug electrode, a smaller amount of etching is required in dry etching when forming the openings for connection to the storage electrodes, and the swell at the openings due to side etching resulting from dry etching can be decreased. Consequently, the short margin between the storage electrode and the data line increases. At the plug electrode connected to the storage electrode, because the diameter of the plug electrode is smaller than the diameter of the opening, the short margin between the storage electrode and the data line further increases.

Further, because the plug electrode can be used not only on the n-channel MISFETs but also on the p-channel MISFETs in the memory cell and in the indirect peripheral circuit, the area required for indirect peripheral circuits, such as a sense amplifier, can be reduced without increasing the process steps.

Further, as described above, even if the underneath plug electrode is exposed in dry-etching the data line during dry-etching the data line material, it is not etched. Therefore, if the line width of the data lines is decreased, no problem arises. Thus, the data lines and the storage electrodes are connected, the short margin of the openings can be increased. More specifically, with the wiring electrode 13 protected by photoresist in the indirect peripheral circuit region, the wiring electrode 13 in the memory cell region is side-etched by isotropic dry etching. Accordingly, the wiring electrode 13 in the memory cell can be decreased in thickness while the wiring electrode 13 in the indirect peripheral circuit region can be made thick at the same time. Therefore, the depth of the opening for the storage electrode in the memory cell can be made shallow, so that the manufacturing process can be made easier. Incidentally, for dry etching the wiring electrode 13, by side etching the material used, the size of the dry-etching mask itself may be reduced to less than the minimum-processing dimension.

Embodiment 2

This embodiment, which concerns the dynamic RAM in the first embodiment but uses a capacitor of a different structure from that of the first embodiment, will be described with reference to FIGS. 11 and 12.

Figure 11:
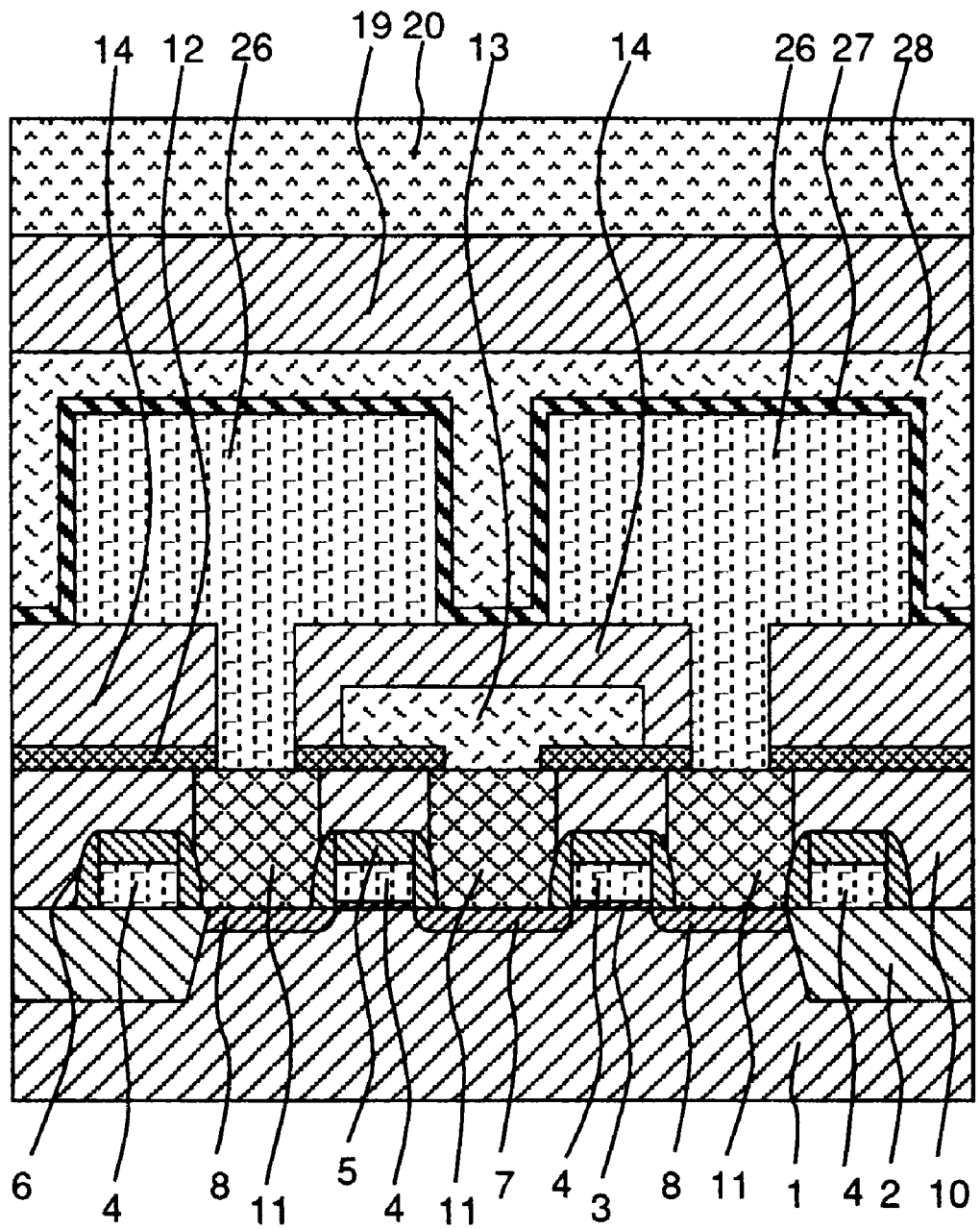
FIG. 11 is a sectional view of the semiconductor memory device according to a second embodiment of the present invention.

FIG. 11 is a sectional view of the dynamic RAM according to a second embodiment. In FIG. 11, the storage electrode 26 (lower electrode) of the capacitor is formed by a thick polysilicon film of about 500 nm in thickness. In other words, the storage electrode is made by depositing a polysilicon film and then merely patterning it to the shape of the storage electrode. According to the second embodiment, the storage electrode is of a structure with the storage capacitance increased by increasing the thickness of the polysilicon film and utilizing the vertical components of the sidewalls of the polysilicon. This capacitor offers the same effects as with the crown-shaped capacitor in the first embodiment.

Note that the capacitor structure is the same as that in the first embodiment excepting that the storage electrode 26 is connected through the opening of the silicon dioxide film 14 to the plug electrode 11 of titanium nitride formed on the highly-doped n-type impurity region 8 of the MISFET. The dielectric film 27 uses a high dielectric film, such as tantalum pentoxide like in the first embodiment.

Figure 12:
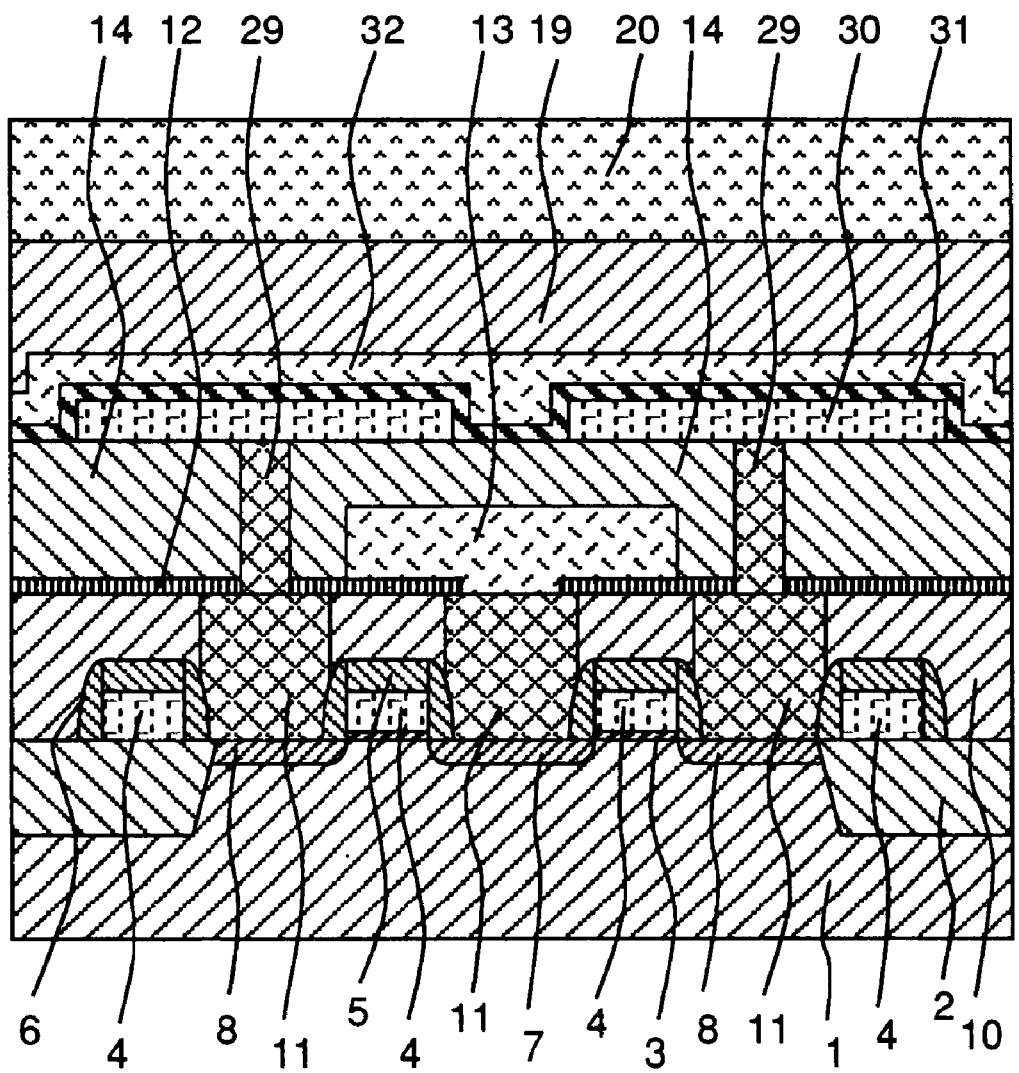
FIG. 12 is a sectional view of the semiconductor memory device according to the second embodiment of the present invention.

FIG. 12 is a sectional view of a dynamic RAM different from that in FIG. 11. In FIG. 12, the storage electrode 30 is formed by a platinum film about 100 nm thick. A capacitor dielectric film 31 made of a (Ba, Sr) TiO$_3$) about 30 nm thick is formed on the storage electrode 30. A plug electrode 29, which passes through the silicon dioxide film 14, is formed in the silicon dioxide film 14 on the wiring electrode 13. Therefore, the storage electrode 30 is connected through the plug electrode 29 to the plug electrode 11 and further electrically connected to the MISFET. Thus, it is possible to use an electrode material that cannot be deposited by a CVD method for better step coverage in forming the storage electrode.

In the second embodiment, as with the plug electrode 11, titanium nitride is preferably used as the material for the plug electrode 29, in which case, when a storage electrode of platinum is connected to the top of the plug electrode 29, no reaction occurs between those electrodes.

In the second embodiment, because a capacitor dielectric film with a high dielectric constant is used, a sufficient storage capacitance can be secured even if a three-dimensional capacitor using the sidewalls of the storage electrode mentioned above is not formed.

Since the storage electrode is thin, the capacitor dielectric film 31 can be formed by sputtering, thus facilitating the manufacture of the dielectric film.

The capacitors described in the two embodiments are made by simpler manufacturing processes than in the crown-shaped capacitor in the first embodiment.

As is obvious from the foregoing, the present invention can be applied regardless of the structure of the capacitor.

The capacitor dielectric films with a high dielectric constant as mentioned above need to be annealed at a high temperature of about 750° C. for crystallization. In the present invention, however, because plug electrodes of titanium nitride are used for connection to the substrate silicon, they do not react with the silicon at the connection points.

The structure of the plug electrode 29 shown in FIG. 12 in the second embodiment can be applied to the crown-shaped capacitors in the first embodiment and to capacitors in other embodiments.

Embodiment 3

Figure 13:
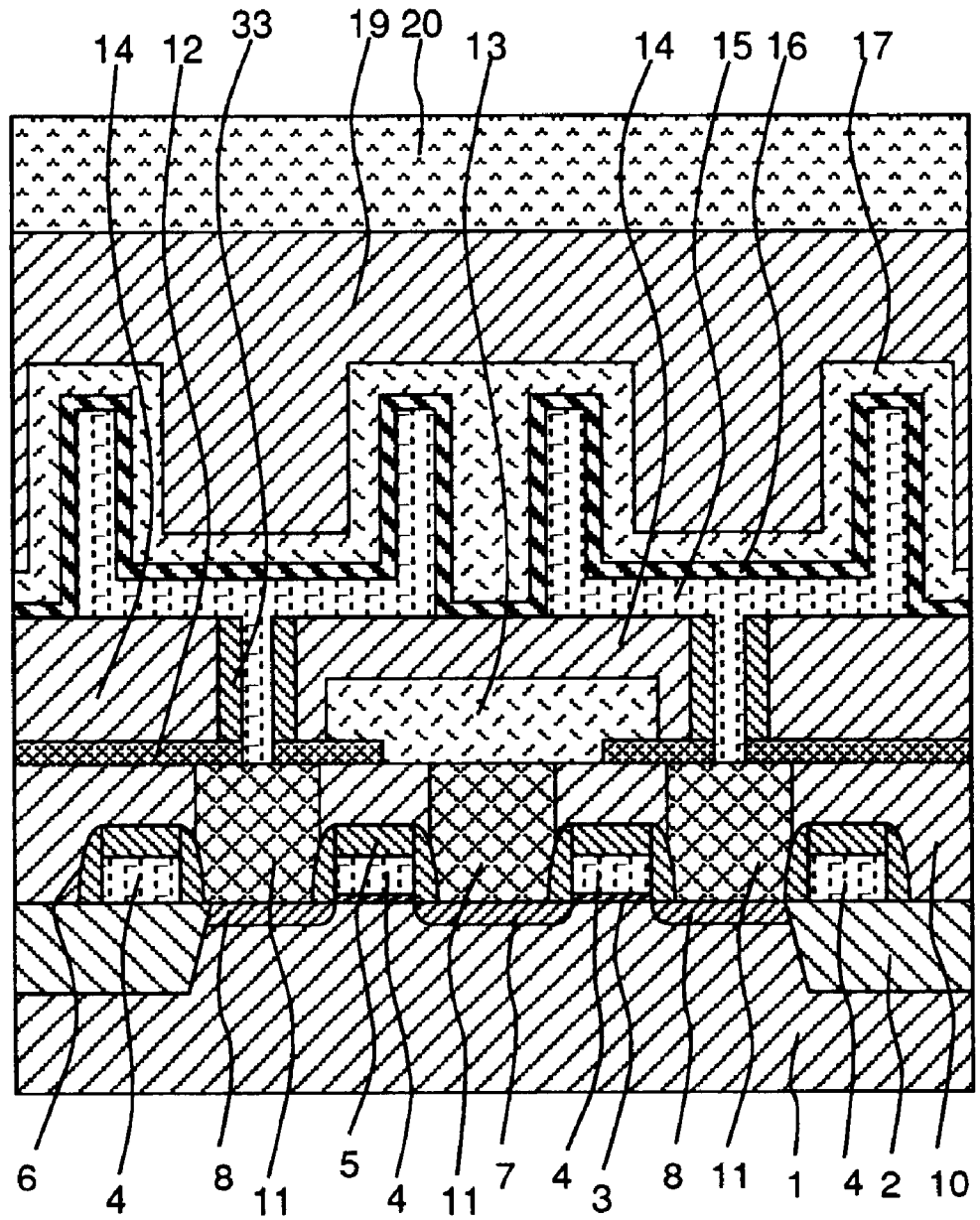
FIG. 13 is a sectional view of the semiconductor memory device according to a third embodiment of the present invention.

A third embodiment relates to the dynamic RAM in the first embodiment and more particularly to the connection method of the storage electrode. FIG. 13 is a sectional view of the dynamic RAM in the third embodiment and shows a method of reducing the diameter of the openings of the silicon dioxide film 14 when connecting the capacitor storage electrode 15 to the plug electrode 11. In FIG. 13, the structure is identical with that in FIG. 1 excepting for the openings of the silicon dioxide film 14. Plug electrodes of titanium nitride are provided on the highly-doped n-type impurity regions of the MISFETs formed on a silicon substrate, and crown-shaped capacitors are formed through the intermediary of the silicon dioxide film 14 over the data line. The openings formed in the silicon dioxide film 14 are decreased in diameter by spacer insulators 33 along the sidewalls of the openings. The capacitor storage electrodes 16 are connected to the plug electrodes 11 through the openings narrowed as described.

The manufacturing process of the third embodiment will be described with reference to FIGS. 14 to 17.

Figure 14:
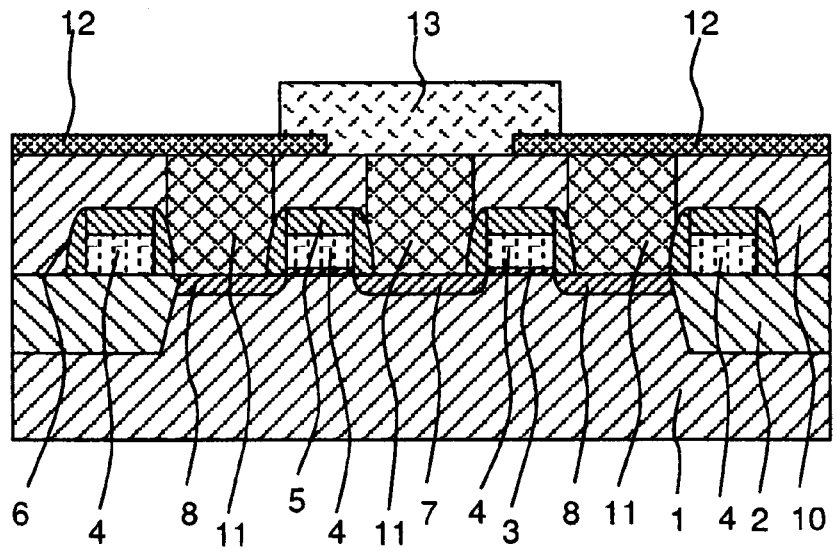
FIGS. 14 to 17 are sectional views for explaining the manufacturing process of the semiconductor memory device according to the third embodiment of the present invention.
Figure 15:
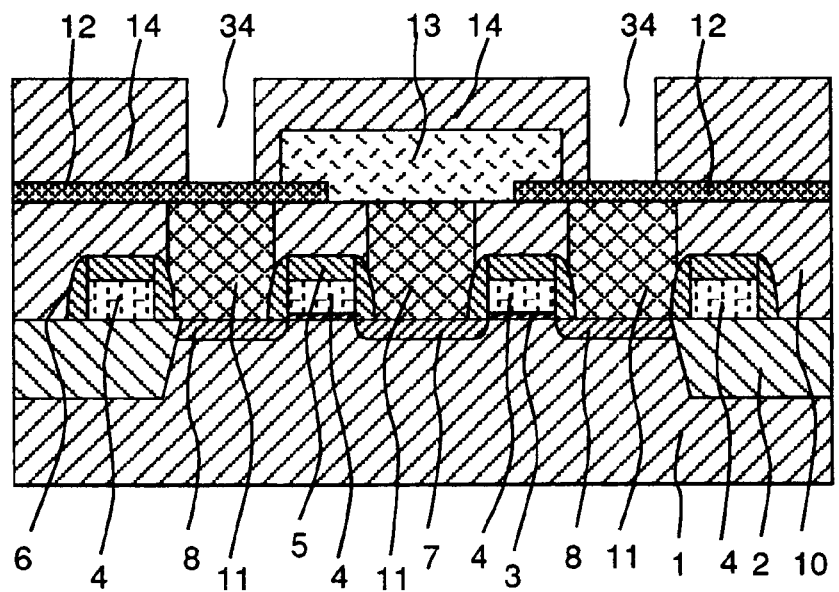

As shown in FIG. 14, the process until MISFETs and data lines are formed on the silicon substrate is the same as in FIG. 7 showing the first embodiment. Subsequently, a silicon dioxide film 14 is deposited on the wiring electrode 13, and openings about 0.2 μm in diameter are formed in the silicon dioxide film 14 by photolithography and dry etching. The 0.2 μm is the minimum processing dimension in photolithography.

Figure 16:
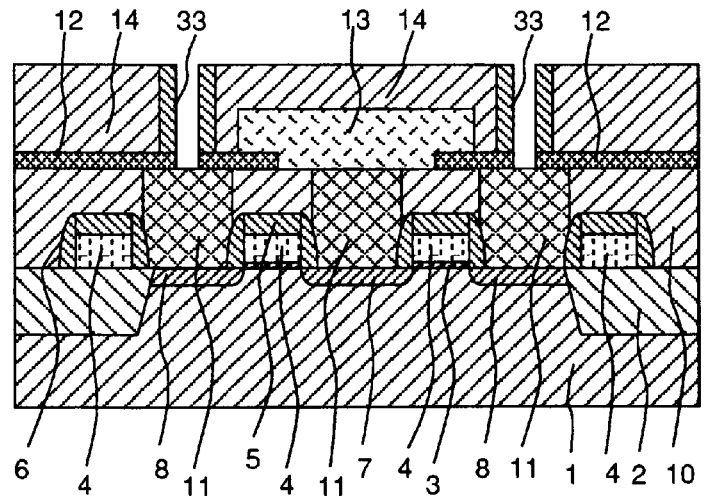

After this, as shown in FIG. 16, a silicon nitride film about 50 nm thick is deposited by a LPCVD method, and a silicon nitride film is formed on the sidewalls of the openings with better covering properties. A spacer insulator 33 is formed on the sidewalls of the openings of the silicon dioxide film 14 by etch-back of the flat portion of the deposited silicon nitride by anisotropic dry etching. After the spacer insulators 33 have been formed, the underneath silicon nitride film 12 may be etched away by overetch to form openings to the plug electrodes 11. By the above-mentioned process, the openings of the silicon dioxide film 14 becomes about 0.1 μm in diameter.

Figure 17:
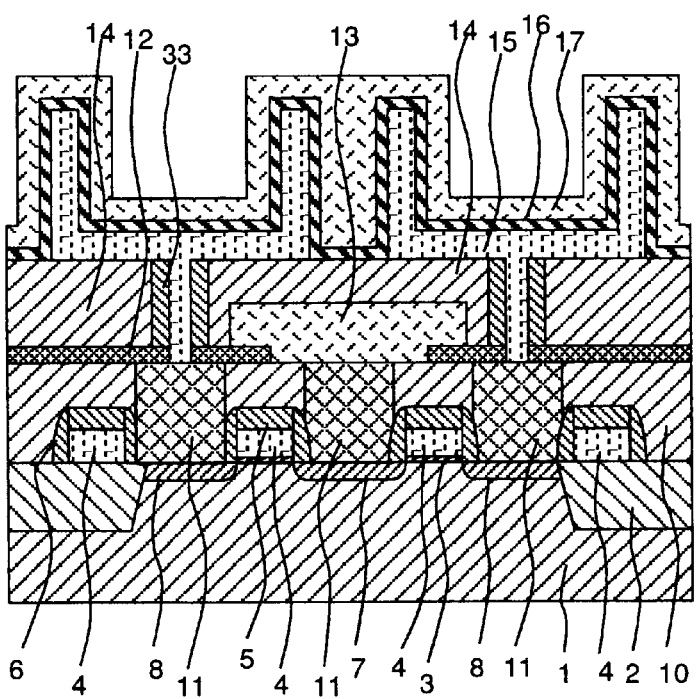

After this, as shown in FIG. 17, a polysilicon film for storage electrode is deposited, the crown-shaped storage electrodes 15 are formed as in the first embodiment, and a capacitor dielectric film 16 and a plate electrode 17 are formed.

According to the third embodiment, in the silicon dioxide film 14 on the wiring electrode 13 as the data line, the openings are formed with a diameter less than the minimum processing dimension, so that the space between the data line and the opening can be reduced and the short margin between the storage electrode and the data line can be increased. According to the third embodiment, description has been made by taking the crown-shaped capacitor as an example, but this embodiment can be applied to the capacitor structure in the second embodiment and other well-known capacitor structures.

Embodiment 4

Figure 18:
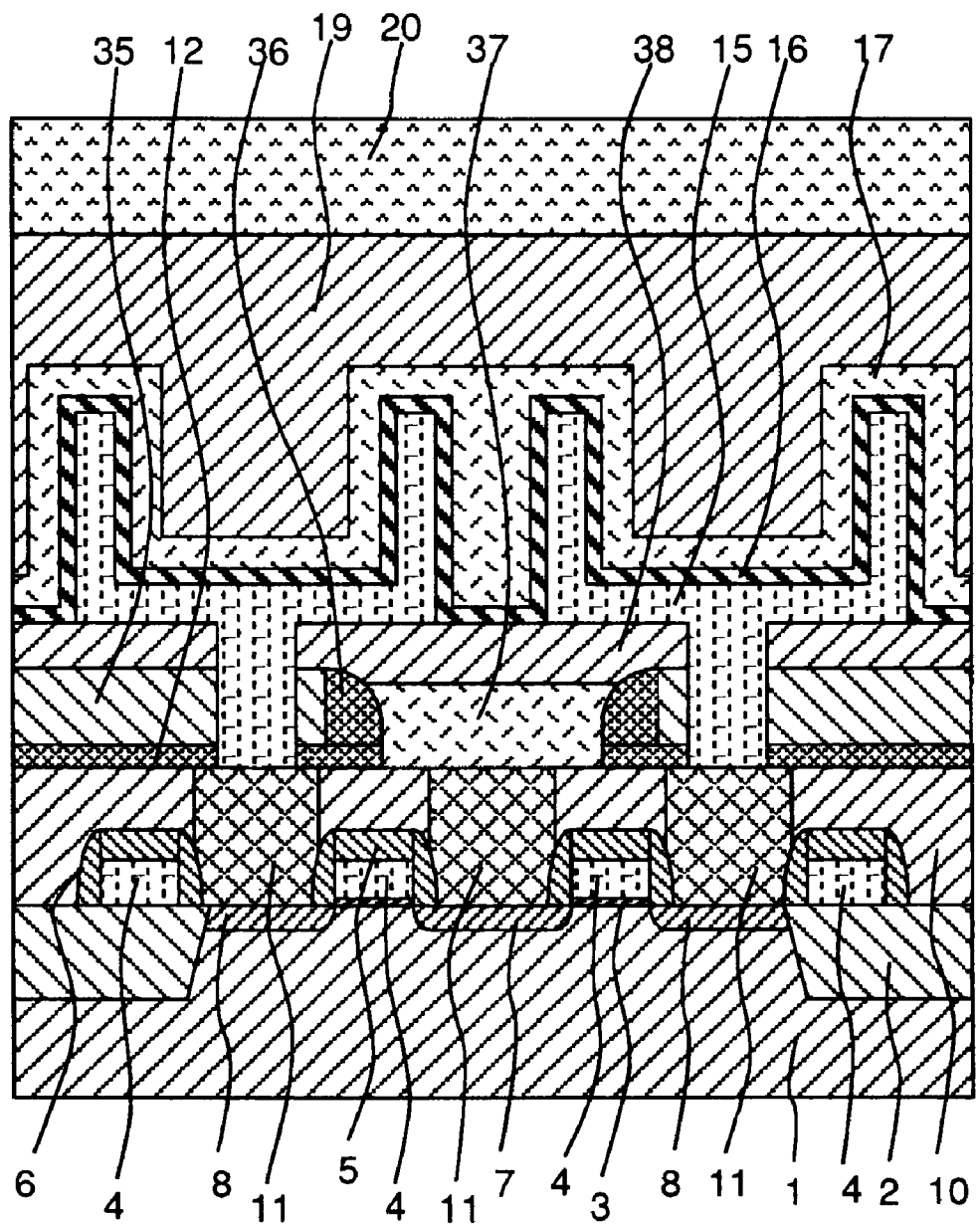
FIG. 18 is a sectional view of the semiconductor memory device according to a fourth embodiment of the present invention.

A fourth embodiment of the present invention relates to the dynamic RAM in the first embodiment and also to a method of reducing the line width of the data line. FIG. 18 is a sectional view of the dynamic RAM according to the fourth embodiment.

In FIG. 18, a wiring electrode 37 as the data line is embedded at the opening formed in the silicon dioxide film 35. A spacer insulator 36 formed by a silicon nitride film is formed at this opening, and the line width of the wiring electrode 37 is determined by the spacer insulator 36. Crown-shaped capacitor storage electrodes 15 are formed over the wiring electrode 37 and on the silicon dioxide film 38 on the silicon dioxide film 35. The storage electrode 15 is connected to the plug electrode 11 through a common opening running through the silicon dioxide films 38, 35 and the silicon nitride film 12.

The fourth embodiment will be described with reference to sectional views of the manufacturing process shown in FIGS. 19 to 24.

Figure 19:
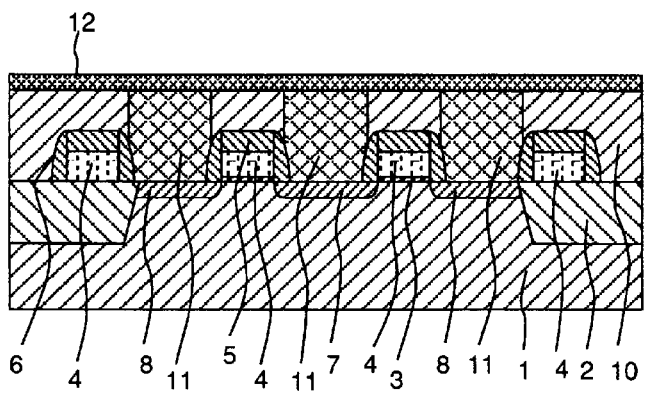
FIGS. 19 to 24 are sectional views for explaining the manufacturing process of the semiconductor memory device according to the fourth embodiment of the present invention.

As shown in FIG. 19, the manufacturing process until the MISFETs and the plug electrodes 11 are formed on the silicon substrate is the same as in FIG. 6 showing the first embodiment. Further, a silicon nitride film 12 is deposited to a thickness of about 50 nm by a LPCVD method.

Figure 20:
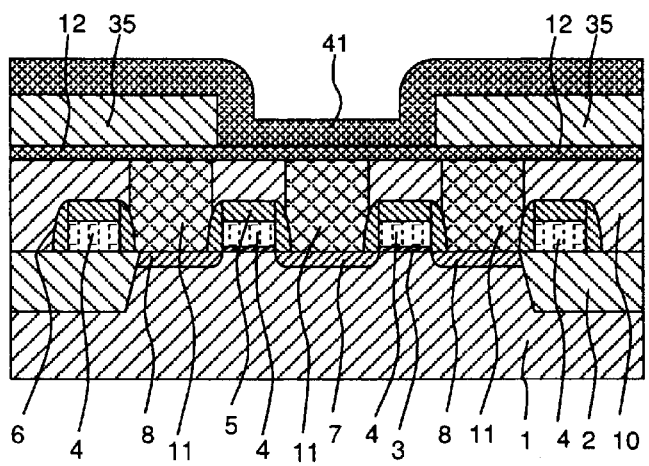

After this, as shown in FIG. 20, a silicon dioxide film 35 about 200 nm in thickness is deposited by CVD using a TEOS gas, openings are formed in the silicon dioxide film 35 according to a pattern of the wiring electrode, and a silicon nitride film 41 about 50 nm thick is deposited with better covering properties by a LPCVD method. Note that a silicon dioxide film may be used instead of the silicon nitride film.

Figure 21:
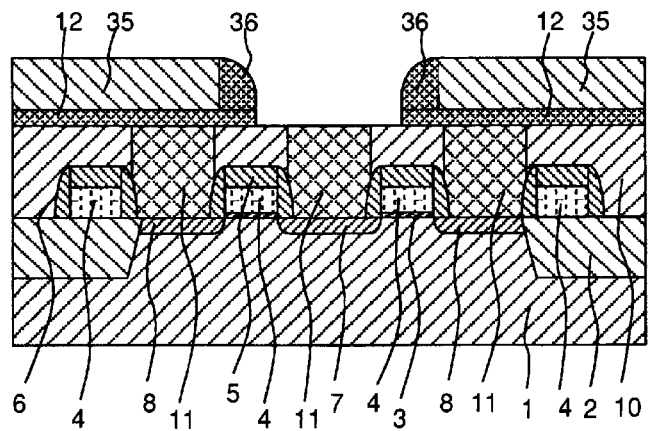

Subsequently, as shown in FIG. 21, the silicon nitride films 41 and 12 are etched by anisotropic dry etching, a spacer insulators 36 are formed on the sidewalls of the silicon dioxide film 35, and at the same time the plug electrode 11 is exposed.

Figure 22:
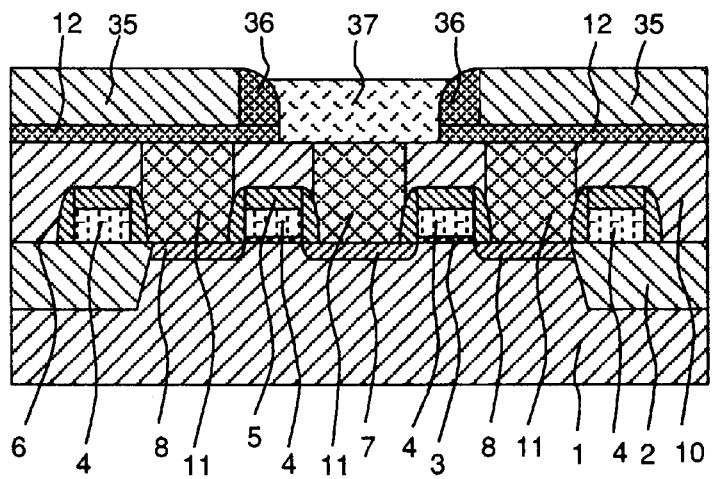

Next, as shown in FIG. 22, a tungsten film about 300 nm thick is deposited. A CVD method is preferred as the deposition method. After this, the tungsten film on the silicon dioxide film 35 is polished by a CMP method to leave the tungsten embedded only in the openings of the silicon dioxide film 35. In this step, it is made sure that the tungsten film is polished about 50 to 100 nm in excess.

Figure 23:
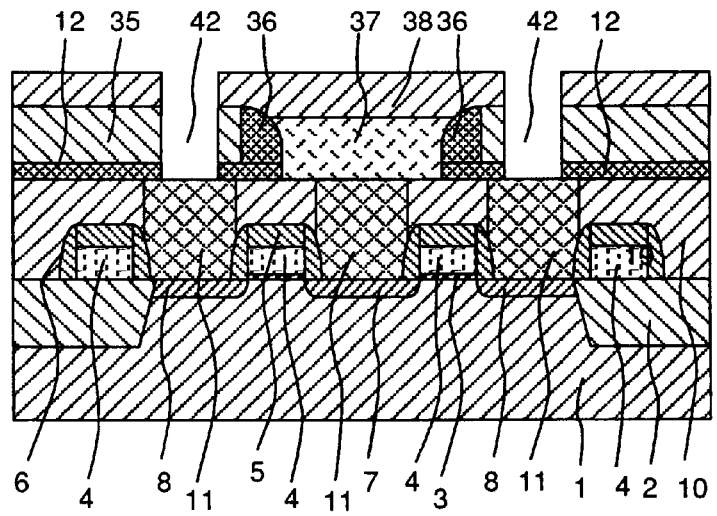

Subsequently, as shown in FIG. 23, a silicon dioxide film 38 is deposited to a thickness of 100 nm, and common openings 42 are formed to run through the silicon dioxide films 38, 35 and the silicon nitride film 12. Incidentally, better effects can be achieved if the openings are formed in combination with the third embodiment.

Figure 24:
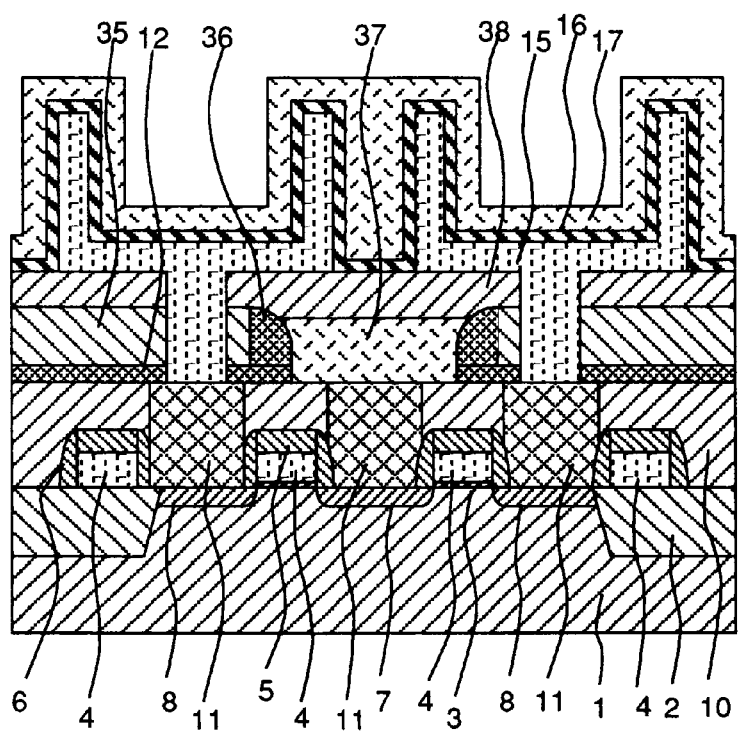

After this, as shown in FIG. 24, a polysilicon used as the storage electrodes 15 is deposited and crown-shaped capacitors are formed as in the first embodiment.

According to the fourth embodiment, because the line width of the wiring electrode 37 as the data line can be reduced to less than the minimum-processing dimension, the short margin between the wiring electrode 37 and the openings for connection to the storage electrodes 15 can be increased.

In the fourth embodiment, description has been made by taking the crown-shaped capacitor as an example, but this embodiment can be applied to the capacitor structure described in the second embodiment and other well-known capacitor structures.

Figure 25:
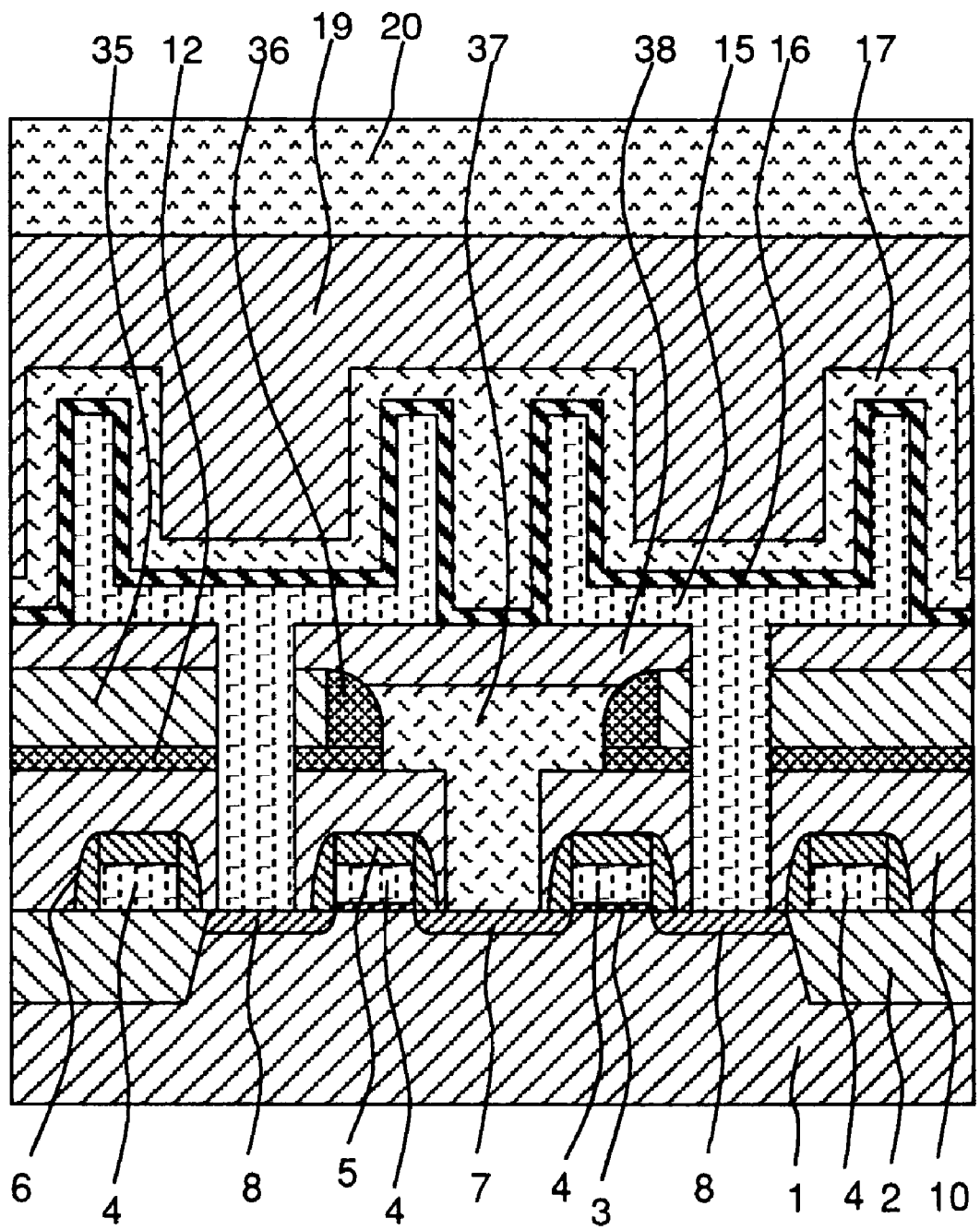
FIG. 25 is a sectional view of the semiconductor memory device according to a fifth embodiment of the present invention.

This embodiment can be applied to memory cells that do not use plug electrodes on the silicon substrate as depicted in FIG. 25 and also to memory cells that use polysilicon plugs.

Further, the fourth embodiment can be used not only to the dynamic RAM but also to wiring used in LSI circuits. In this case, as the material for the wiring electrode 37, a low resistivity metal such as aluminum or copper can be used in addition to high refractory metal with heat resistance.

Embodiment 5

Figure 26:
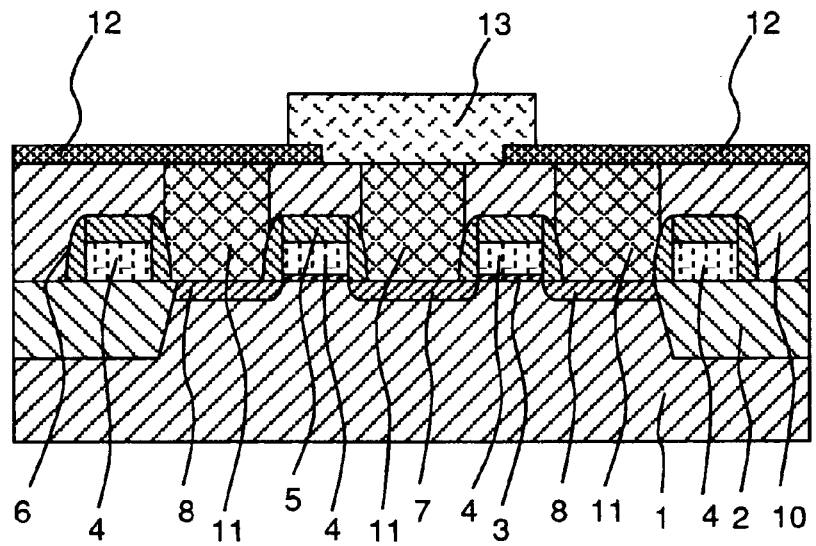
FIGS. 26 to 31 are sectional views for explaining the manufacturing process of the semiconductor memory device according to the fifth embodiment of the present invention.

A fifth embodiment of the present invention relates to a memory cell of dynamic RAM type, which uses platinum for the capacitance electrode of the capacitor, and more particularly relates to micro-scale processing of a platinum electrode. FIG. 26 shows the manufacturing process of a dynamic RAM according to the fifth embodiment, in which platinum is used for the capacitance electrode of the capacitor in order that a BST film of high dielectric constant or a PZT film of ferro-dielectric is used for the capacitor of a memory cell.

As shown in FIG. 26, MISFETs are formed on the silicon substrate. The manufacturing process until the plug electrodes 11 and the wiring electrodes 13 are formed is the same as the process up to FIG. 7 in the first embodiment.

Figure 27:
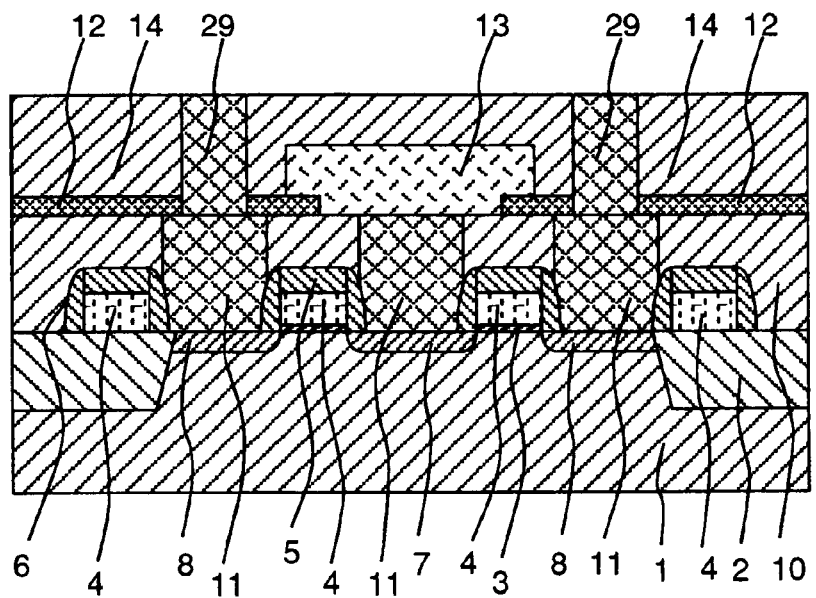

After this, as shown in FIG. 27, a silicon dioxide film 14 about 0.5 to 1 μm is deposited at a temperature of about 400° C. by a well-known CVD method using a TEOS gas, and the surface is flattened by a well-known CMP method. Further, when openings are formed in the silicon dioxide film 14 and the silicon nitride film 12 by photolithography and dry etching, and a titanium nitride film about 200 nm thick is deposited by a CVD method. After this, the plug electrodes 29 are formed by etch-back of the deposited titanium nitride film at the flat portion by anisotropic dry etching.

Figure 28:
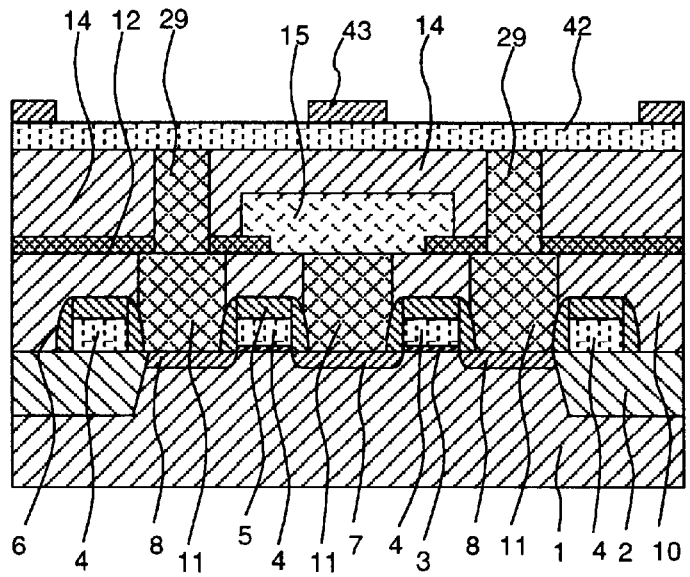

Subsequently, as shown in FIG. 28, a platinum film 45 with a thickness of 100 to 300 nm is deposited by sputtering, and an amorphous silicon film 43 is deposited to a thickness of about 100 nm. The amorphous silicon film 43 is patterned by photolithography and dry etching.

Figure 29:
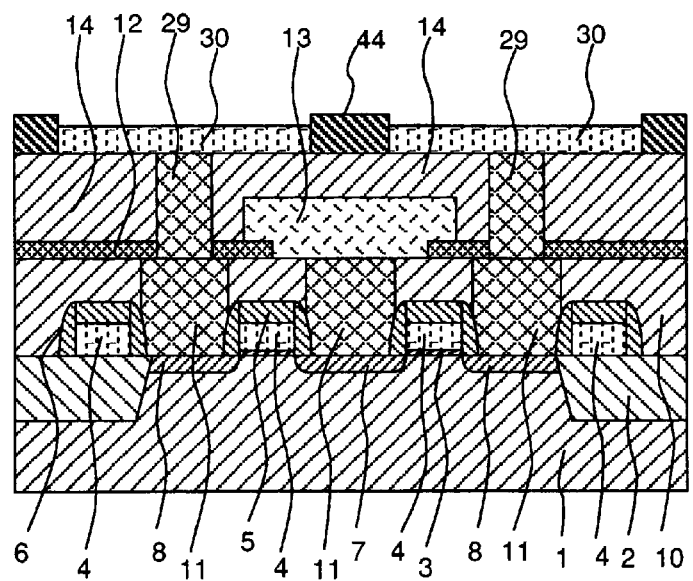

Next, as shown in FIG. 29, the multilayered body thus produced is annealed to let the amorphous silicon film 43 and the platinum film 30 react each other to form platinum silicide 44 at the patterned portions. That portion of the platinum film 30 where there was no amorphous silicon film remains as is.

Figure 30:
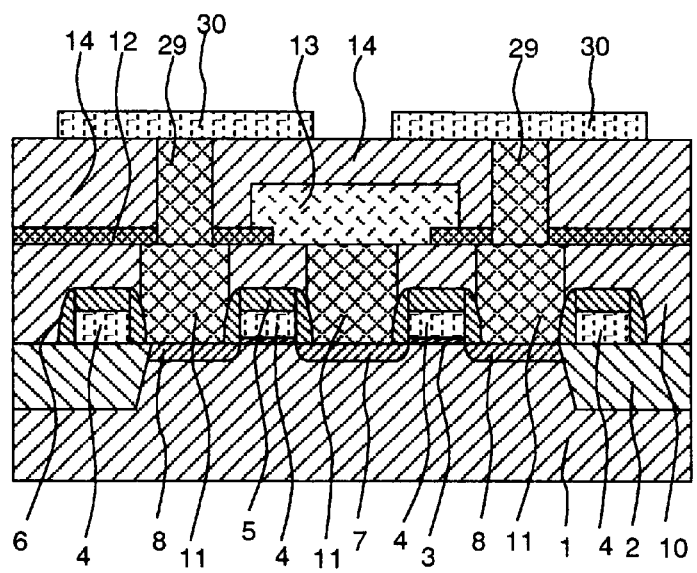
Figure 31:
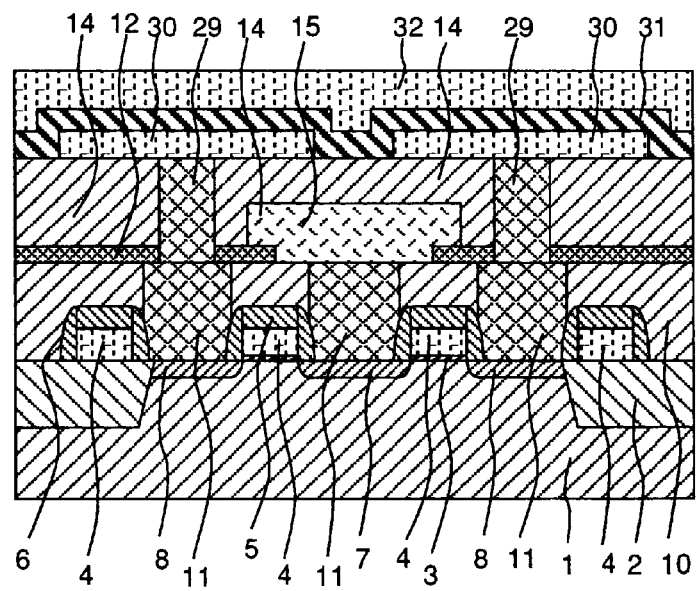

After this, as shown in FIG. 30, the platinum silicide 44 is removed by wet etching using a hydrofluoric acid solution, and thus platinum electrodes 30 are formed. It is advisable to provide a stopper to wet etching beneath the platinum films 30, though this step is omitted here.

Further, as shown in FIG. 30, a BST film 30 is deposited on the platinum film 30 by sputtering or CVD, and a platinum film 32 is deposited additionally, which is patterned by photolithography and dry etching. The subsequent process may be the same as in the first embodiment.

According to the fifth embodiment, the platinum electrodes can be patterned in a fine geometry without directly etching the platinum film. Therefore, it is possible miniaturize a capacitor which uses the platinum film as the storage electrode.

Embodiment 6

Figure 32:
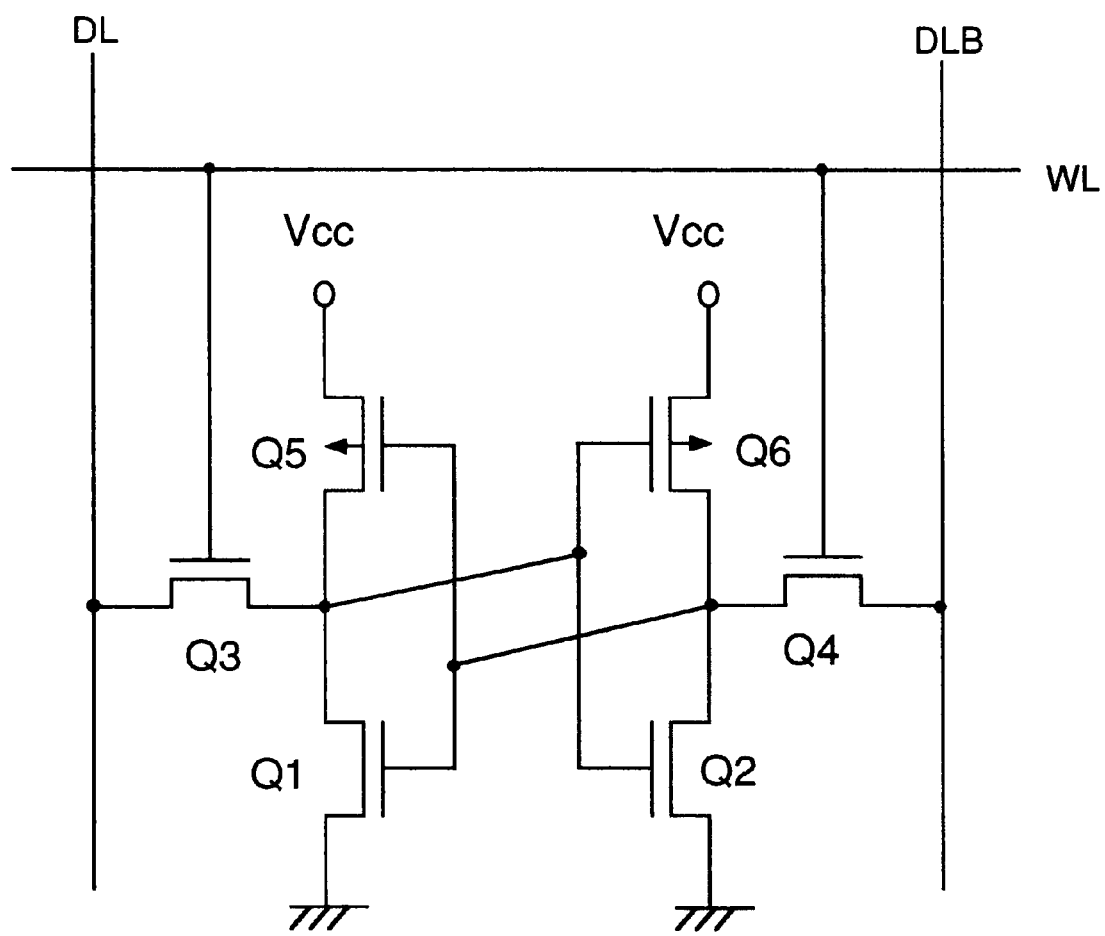
FIG. 32 is an equivalent circuit diagram of the semiconductor memory device according to a sixth embodiment of the present invention.
Figure 33:
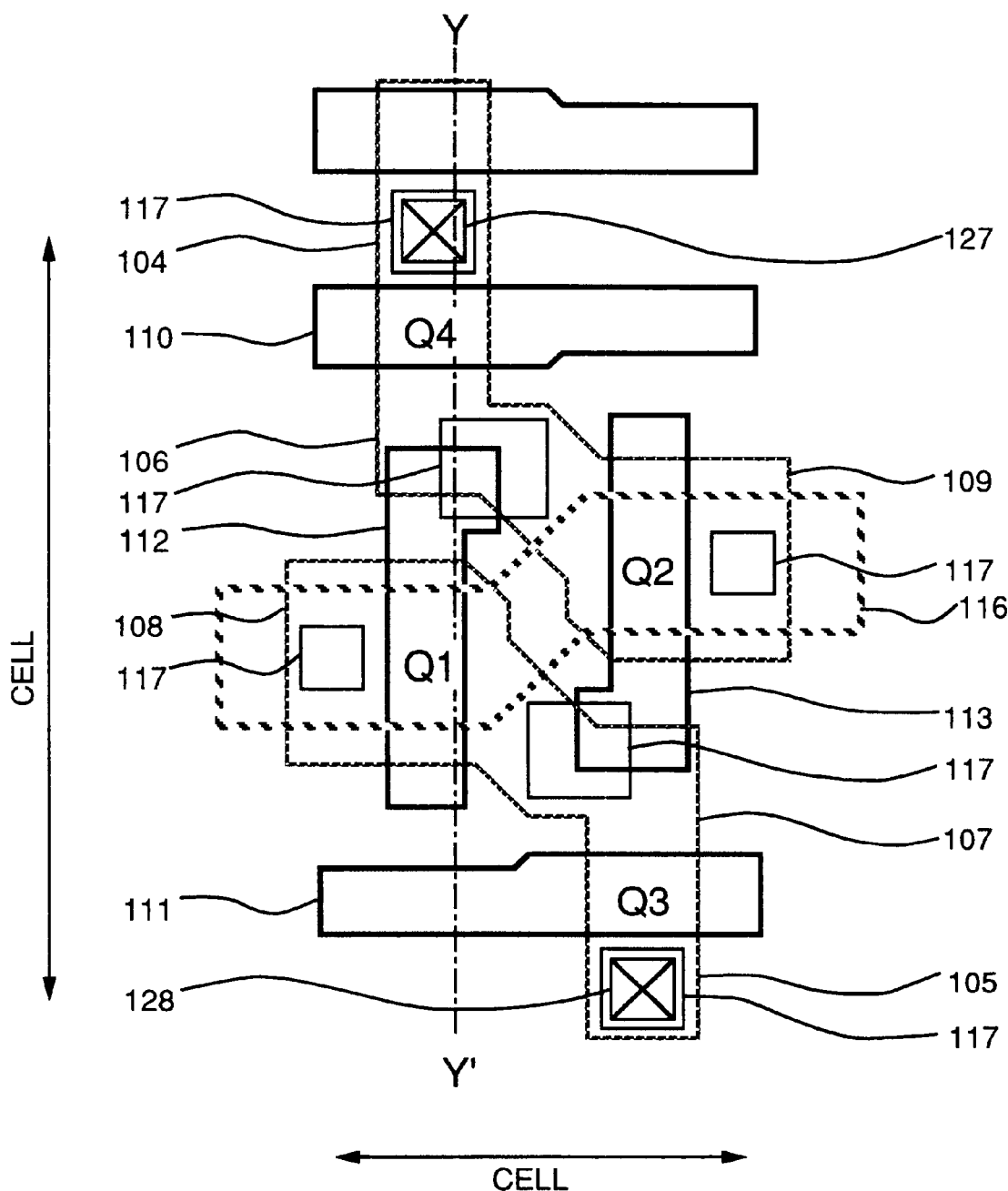
FIG. 33 is a plan view of the semiconductor memory device according to the sixth embodiment of the present invention.
Figure 34:
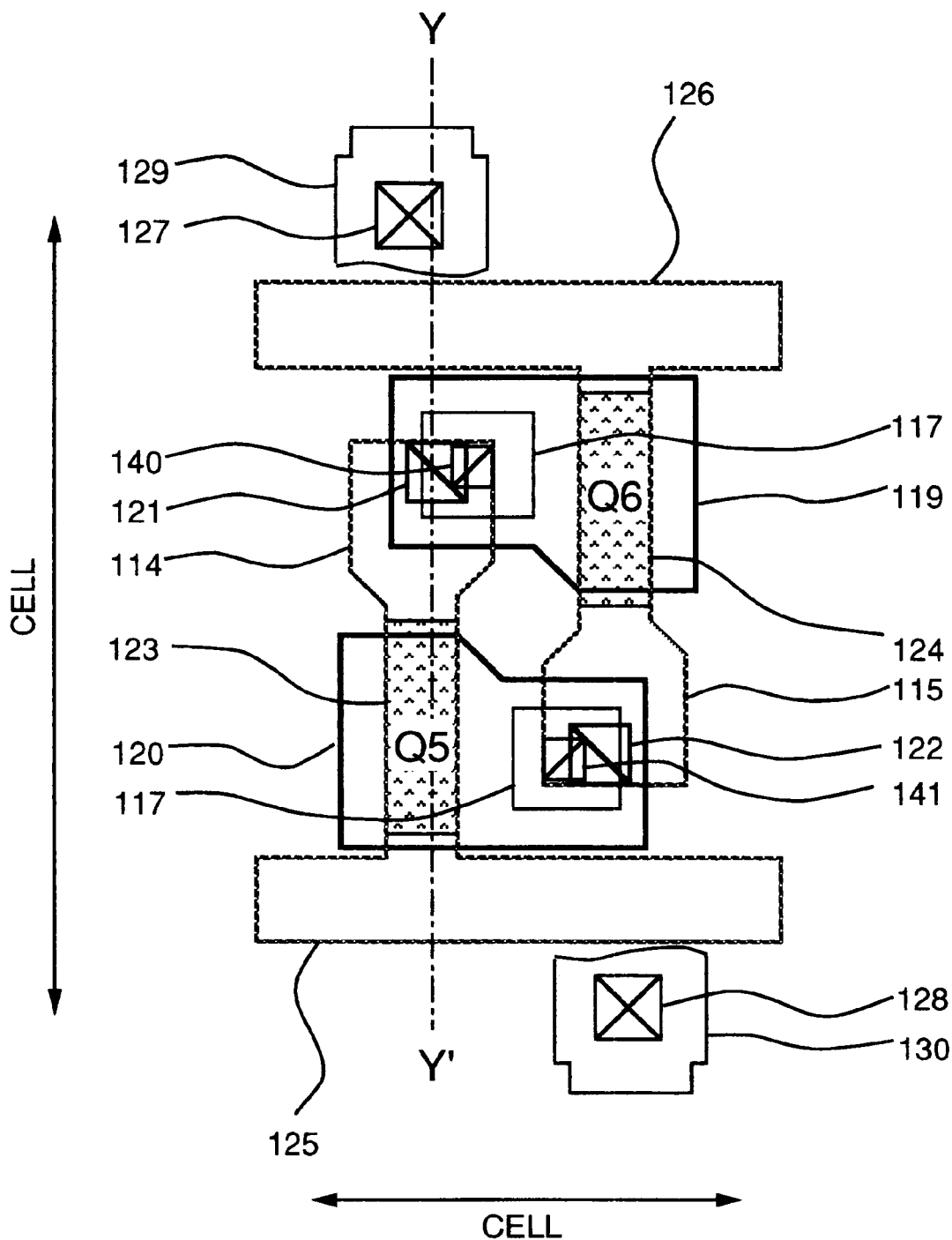
FIG. 34 is a plan view of the semiconductor memory device according to the sixth embodiment of the present invention.

A sixth embodiment of the present invention relates a static RAM to which the present invention is applied. FIG. 32 shows an equivalent circuit of the memory cell of a static RAM. The memory cell comprises a flip-flop circuit having a pair of inverters, which include n-channel MISFETs (Q1, Q2) and p-channel MISFETs (Q5, Q6), arranged in cross connection, and transfer transistors (Q3, Q4) connected to the flip-flop. FIGS. 33 and 34 are plan views each showing a static RAM of a structure suitable for high element integration, which has p-channel MISFETs formed in polysilicon layers. FIG. 33 shows the MISFET portions formed on the silicon substrate, while FIG. 34 shows the TFT (Thin Film Transistor) portions and the wiring electrode portions formed in the polysilicon film.

In FIG. 33, the gate electrodes of the driver MISFETs are connected to storage nodes formed by highly-doped n-type impurity regions 106, 107 as the respective drains through plug electrodes 117 of titanium nitride formed in the openings. Further, plug electrodes 117 of titanium nitride in the openings of the highly-doped n-type impurity regions 108, 109 as the sources of the driver MISFETs are connected to the ground lines 116. Further, the highly-doped n-type impurity regions 106, 107 at the storage nodes also serve as highly-doped impurity regions of the transfer MISFETs Q3, Q4, and the gate electrodes 110, 111 of the transfer MISFETs serve as word lines common to adjacent memory cells. Plug electrodes 117 are formed in the openings of the highly-doped n-type impurity regions 104, 105 of the transfer MISFETs, and the plug electrodes 117 are connected to the wiring electrodes 129,130 (FIG. 34) as the data lines.

In FIG. 34, plug electrodes 117 formed in the storage nodes are connected through openings 140, 141 to the gate electrodes 119, 120 of the p-channel TFTs (Q6, Q5) as the load elements. Further, the gate electrodes 119, 120 are connected through openings 121, 122 to the drain regions 114, 115 of the other TFTs. The source regions 125, 126 of the TFTs (Q5, Q6) are the common power supply wirings for the adjacent memory cells.

Figure 35:
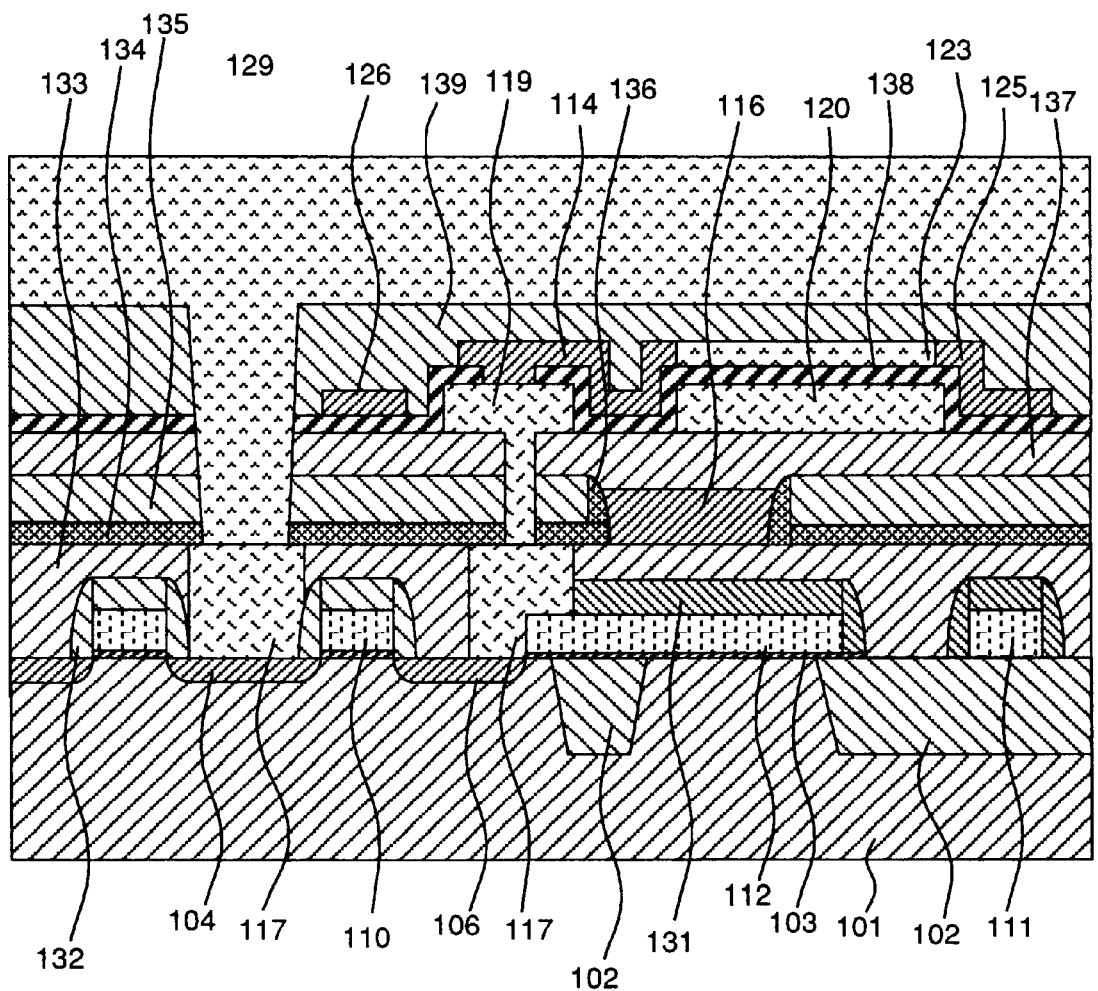
FIG. 35 is a sectional view of the semiconductor memory device according to the sixth embodiment of the present invention.

Referring to FIG. 35, the sixth embodiment will be described in greater detail. FIG. 35 is a sectional view taken along the line X–X' in the plan views in FIGS. 33, 34.

The n-channel MISFETs of the memory cell are formed on the surface of the silicon substrate. The plug electrodes 117 are formed on the highly-doped n-type impurity regions 104, 106 and the gate electrode 112. The wiring electrode 116 of the structure described in the fourth embodiment is formed on the silicon dioxide film 133. Tungsten is preferred as the material for the wiring electrode 116. The wiring electrode 116 acts as the ground line to supply a ground potential to the source of the sources of the driver MISFETs. The gate electrodes 119, 120 of TFTs, which are made of a p-type polysilicon film, are formed over the wiring electrode 116 through the intermediary of the silicon dioxide film 137. A gate insulator 138 for the TFT is formed on the gate electrode 120. The TFT channel region 123 made of polysilicon, a source region 125 and a drain region 114 are formed on the gate electrode 138. The drain region 114 of one TFT is connected through an opening, formed at a part of the gate insulator 138, to the gate electrode 119 of the other TFT, by which the cross connection of the flip-flop can be achieved. Further, this gate electrode 119 is connected to the plug electrode 117 through an opening which is smaller than the diameter of the plug electrode 117.

According to the sixth embodiment, because a large short margin can be secured between the ground line of the memory cell and the gate electrodes of the TFTs, the memory cell area of the static RAM can be reduced. Further, because the p-channel TFT and the n-channel MISFET formed on the silicon substrate are connected through a plug electrode made of titanium nitride, an electrically ohmic contact can be obtained.

Embodiment 7

Figure 36:
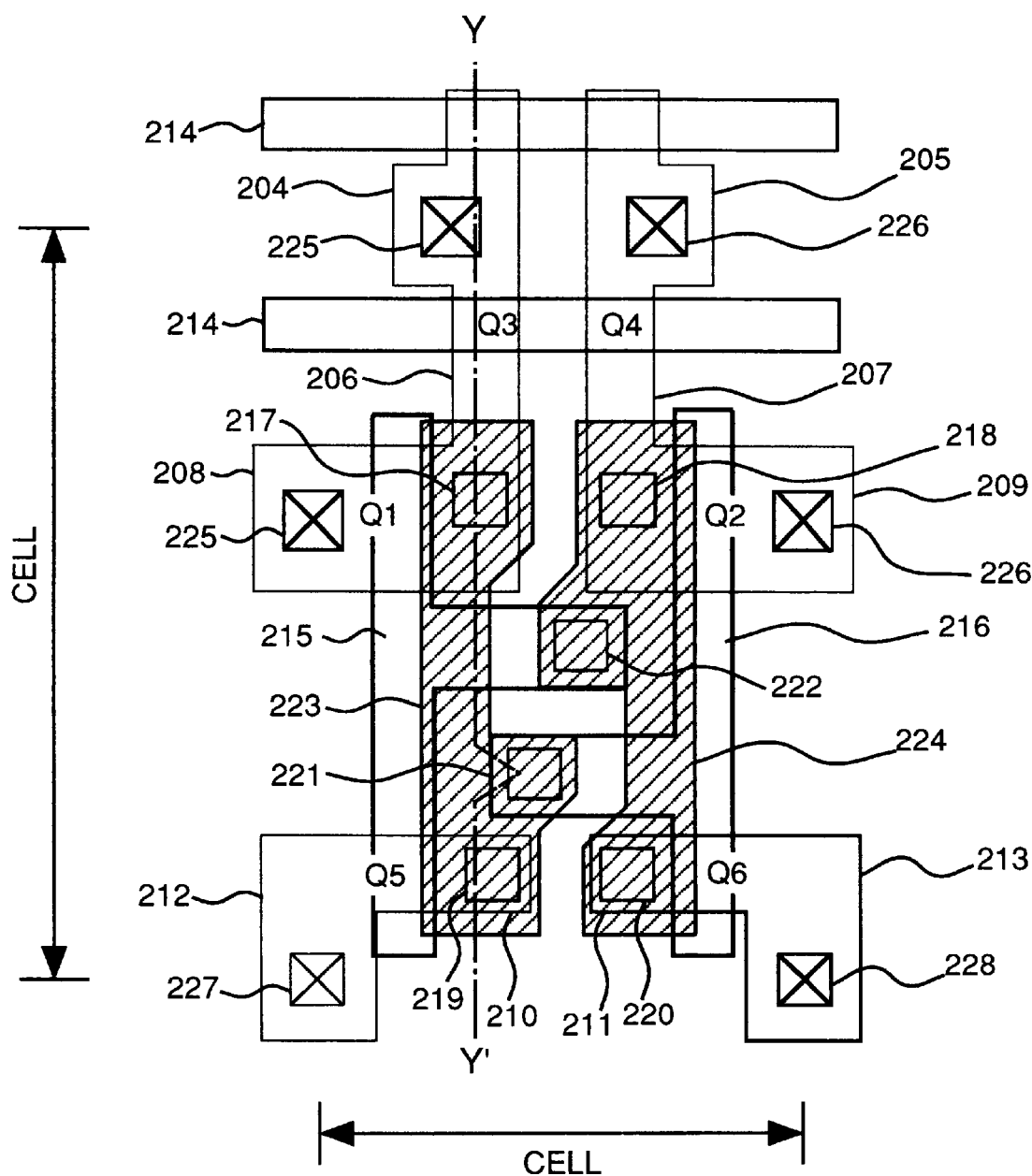
FIG. 36 is a plan view of the semiconductor memory device according to a seventh embodiment of the present invention.
Figure 37:
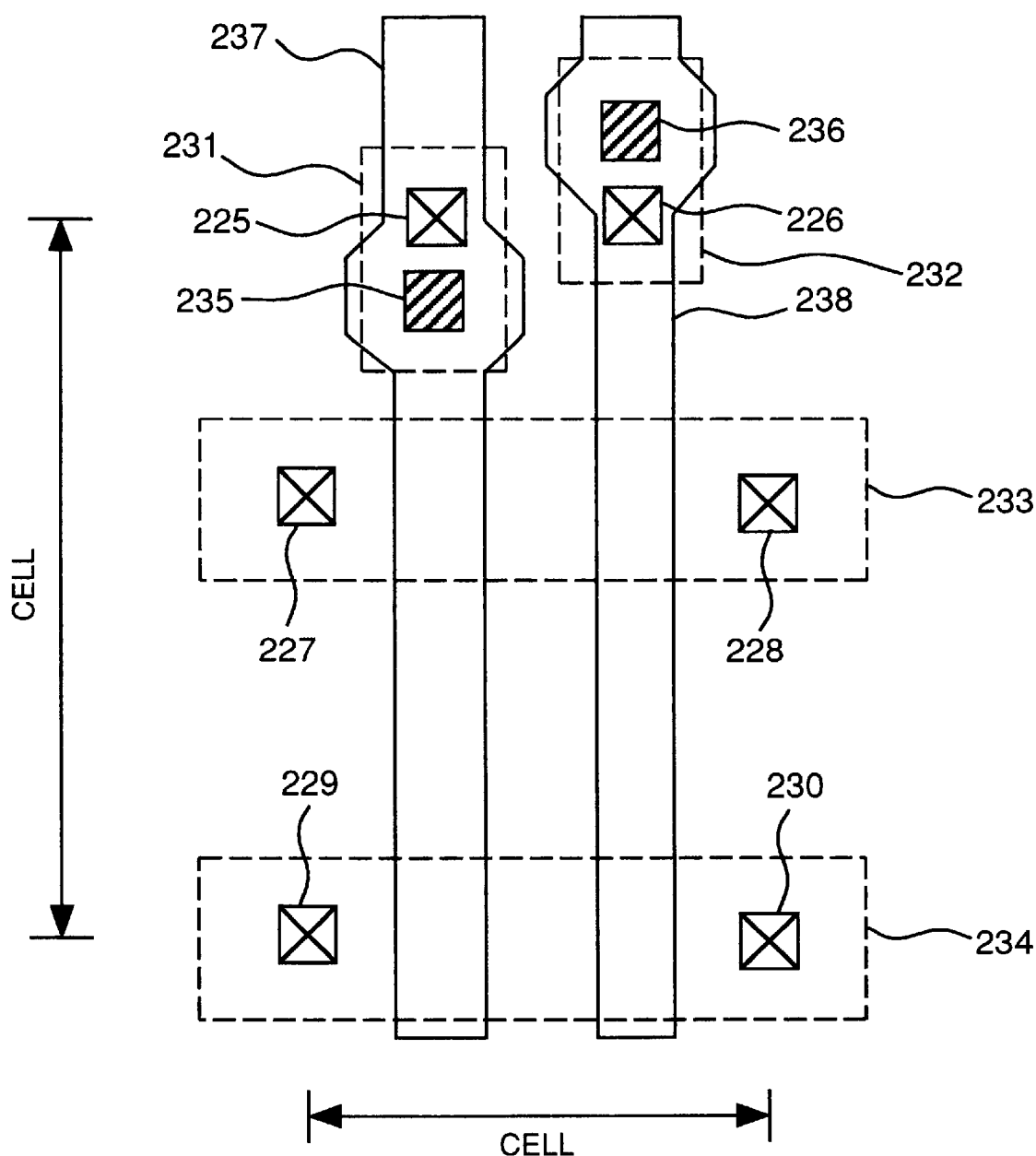
FIG. 37 is a plan view of the semiconductor memory device according to the seventh embodiment of the present invention.

A seventh embodiment of the present invention is an application of the present invention to a static RAM in which an n-channel MISFET and a p-channel MISFET are all formed on a silicon substrate. FIGS. 36 and 37 are plan views of static RAMs according to the seventh embodiment. FIG. 36 shows MISFETs and local wiring area and FIG. 37 shows wiring electrodes.

In FIG. 36, MISFETs Q1, Q2, Q3, Q4, Q5 and Q6 correspond to the equivalent circuit in FIG. 32. A gate electrode 215 is a gate electrode for Q1 and Q5. A gate electrode 216 is a common gate electrode for Q2 and Q6. Plug electrodes 217, 218, 219 and 220 are formed on the highly-doped n-type impurity regions 206, 207 of the n-channel MISFETs Q1, Q2, Q3 and Q4 and on the highly-doped p-type impurity regions 210, 211 of the p-channel MISFETs Q5, Q6. Plug electrodes 221 and 222 are formed on the gate electrodes 215, 216. In other words, the cross connection of the flip-flop of the memory cell is formed by the plug electrodes 217, 218, 219, 220, 221 and 222 and local wirings 223 and 224 formed by a tungsten film of about 100 nm in thickness. Those plug electrodes are made of titanium nitride, are formed by a similar method as in the first embodiment and the range of their height is from 50 nm to 150 nm or so.

Metal wirings 231, 232, 233, 234 in the first layer shown in FIG. 37 are installed through openings 225, 226, 227, 228, 229 and 230 in the highly-doped n-type impurity regions 204, 205 of MISFETs Q3 and Q4, the highly-doped n-type impurity regions 208, 209 of MISFETs Q1 and Q2 and the highly-doped p-type impurity regions 212, 213 of MISFETs Q5, Q6. The metal wiring 233 is ground wiring to supply ground potential to the sources of the driver MISFETs Q1 and Q2. The metal wiring 234 is power supply wiring to supply power to the sources of driver MISFETs Q1 and Q2. Further, the data lines of the memory cell are formed by metal wirings 237, 238 of the second layer. The metal wirings 231, 232, 233, 234, 237 and 238 are made of aluminum.

Figure 38:
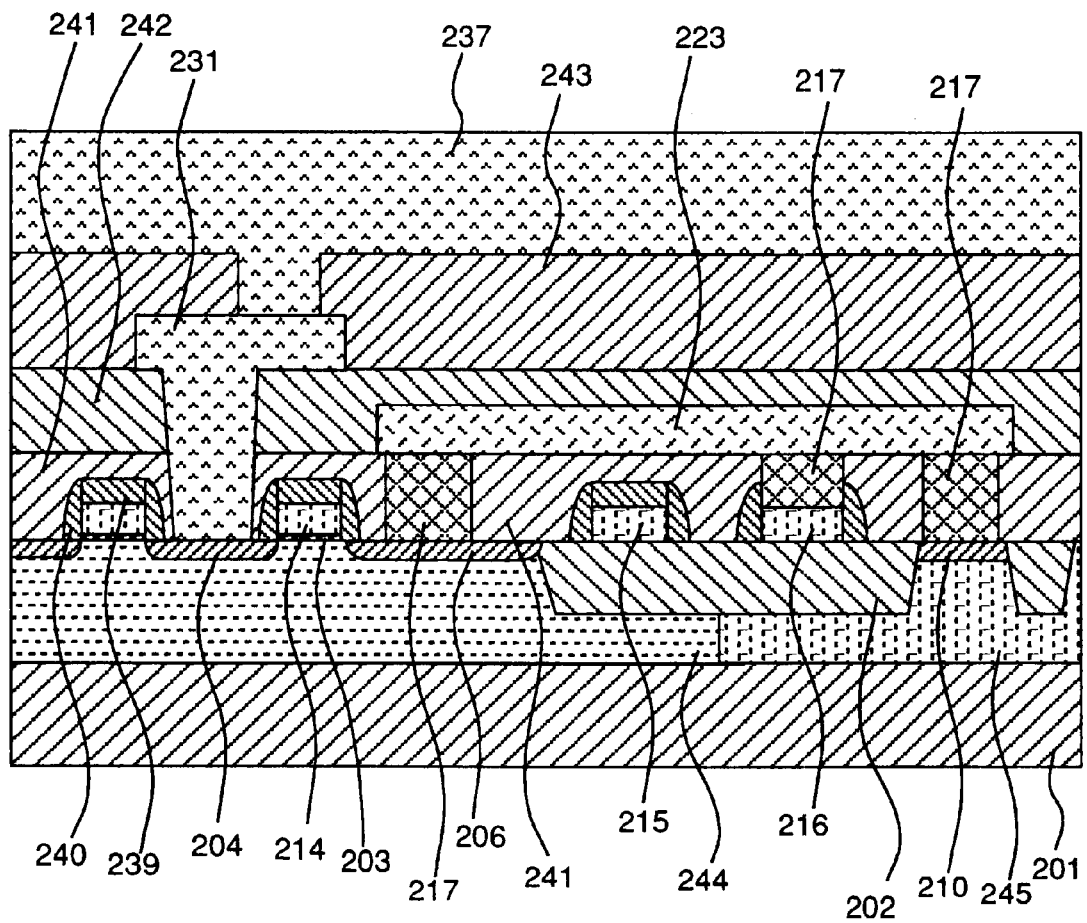
FIG. 38 is a sectional view of the semiconductor memory device according to the seventh embodiment of the present invention.

FIG. 38 is a sectional view of the seventh embodiment. The n-channel MISFET and the p-channel MISFET in the memory cell are formed respectively in a p-well 244 and an n-well 245 in a silicon substrate 201. In the seventh embodiment, as in the first embodiment, silicon nitride films 239, 240 are provided at the top and sidewalls of the gate electrode of the MISFETs so that self-aligned contacts can be formed. In this case, when forming the plug electrodes 217 on the gate electrode 216, photolithography and dry etching, different from those processes used in forming other plug electrodes, should preferably be carried out. Though not shown, if silicon nitride is used as the etching stopper for the isolation, a structure is obtained that can be borderless.

According to the seventh embodiment, the local wiring can be microminiaturized, so that a static RAM with high device integration can be provided.

Embodiment 8

Figure 39:
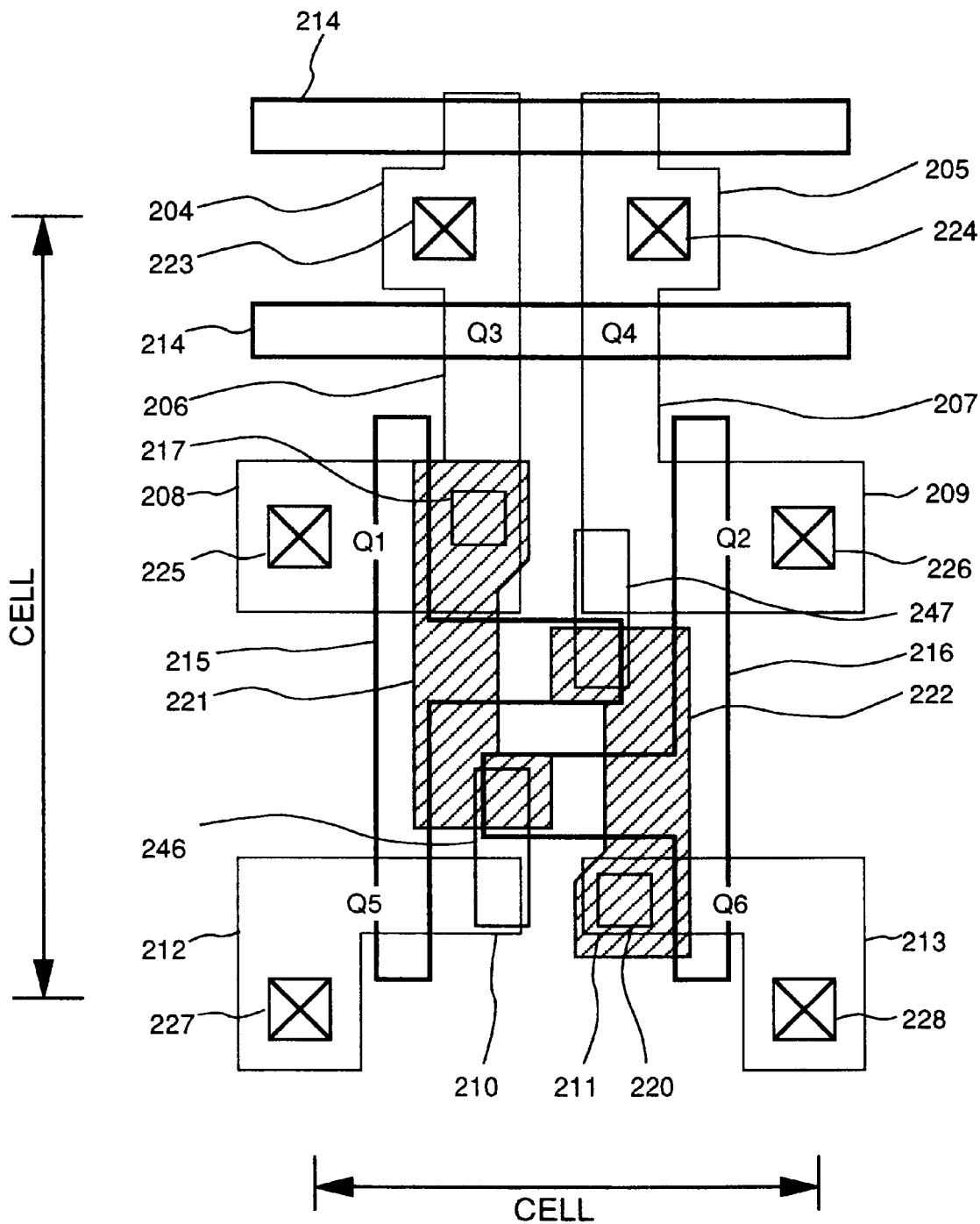
FIG. 39 is a plan view of the semiconductor memory device according to an eighth embodiment of the present invention.
Figure 40:
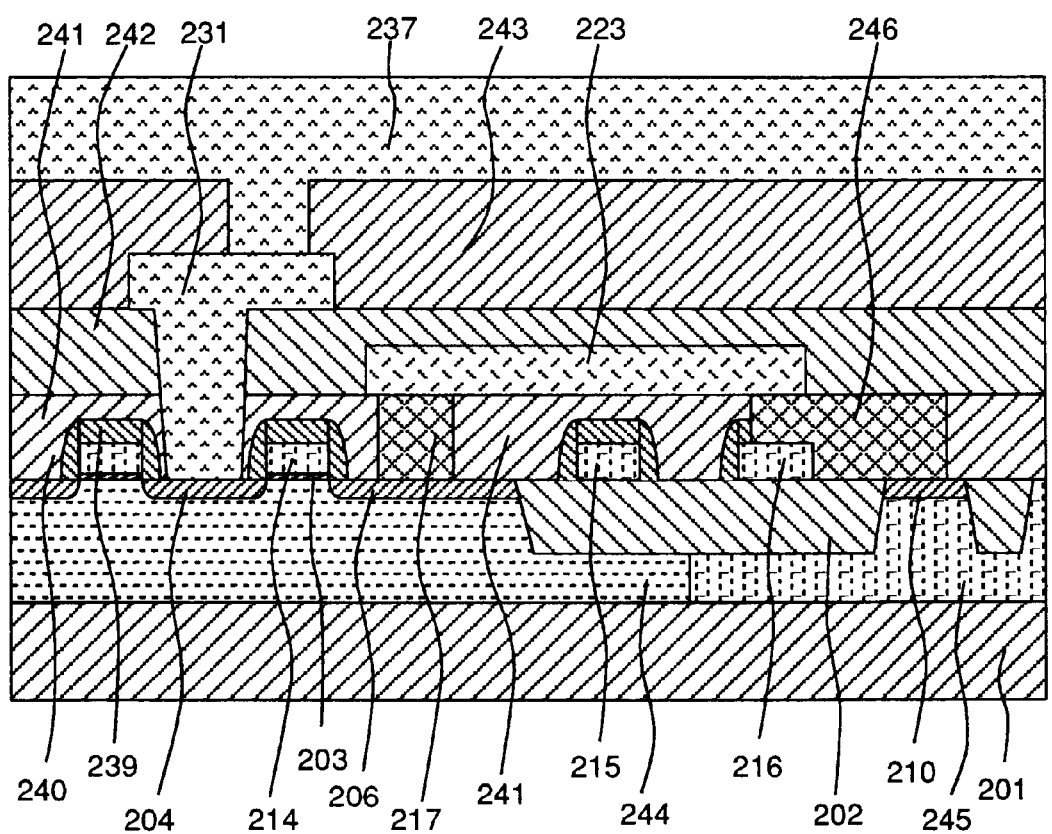
FIG. 40 is a sectional view of the semiconductor memory device according to the eighth embodiment of the present invention.

An eighth embodiment of the present invention is an improved version of the static RAM in the seventh embodiment, in which the cross connection of the flip-flop circuit can be achieved with four plug electrodes. FIG. 39 is a plan view of the static RAM according to the eighth embodiment, in which the wiring electrode portion, being identical to that in the seventh embodiment, is omitted here. FIG. 40 is a sectional view. In FIGS. 39 and 40, the plug electrode 217 on the highly-doped n-type impurity region 206 of the driver MISFET is connected to the local wiring 221 formed by tungsten about 100 nm thick, which is above the plug electrode 217. The local wiring 221 is also connected to the common gate electrode 216 of the mating inverter (Q2, Q6) and at the same time to the highly-doped p-type impurity region 210 of the load MISFET Q5, by a plug electrode 246 which extends on the common electrode 246 and the region 210. A plug electrode 247 in FIG. 39 is connected in a similar manner. The above-mentioned plug electrodes are made of titanium nitride, and formed by the same method as in the first embodiment.

According to the eighth embodiment, the local wiring can be further miniaturized and a static RAM with high device integration can be provided.

Embodiment 9

Figure 41:
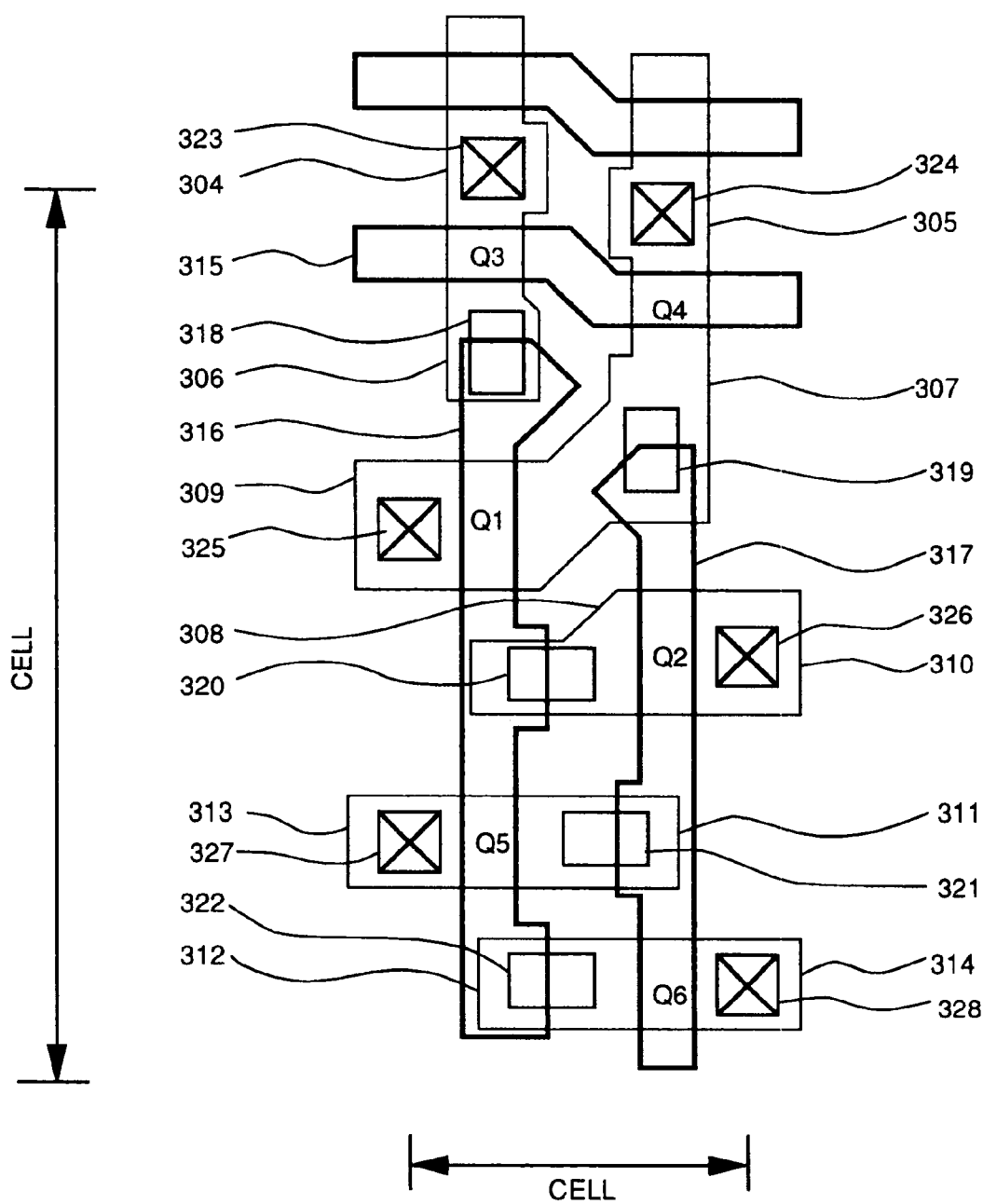
FIG. 41 is a plan view of the semiconductor memory device according to a ninth embodiment of the present invention.
Figure 42:
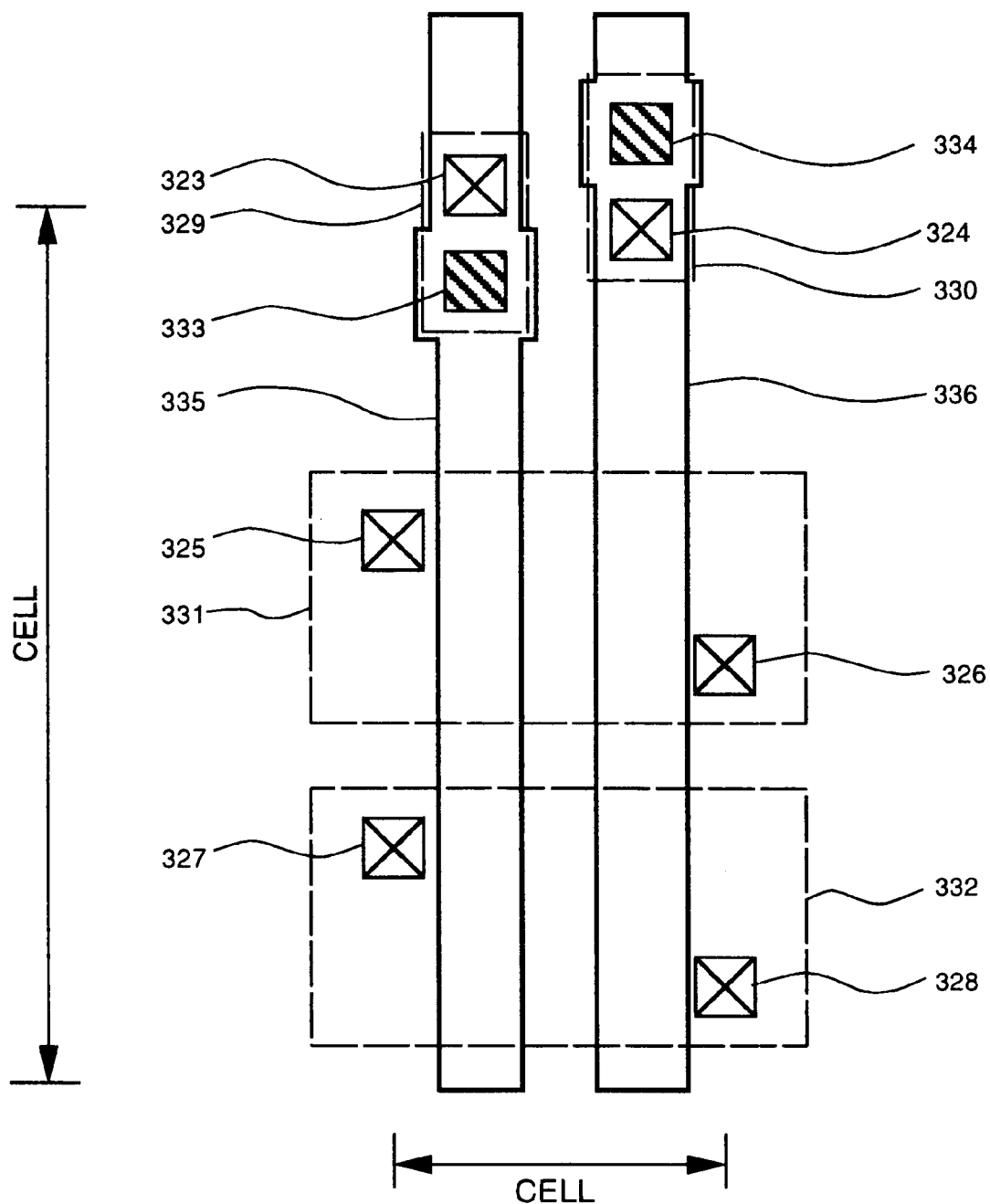
FIG. 42 is a plan view of the semiconductor memory device according to the ninth embodiment of the present invention.
Figure 43:
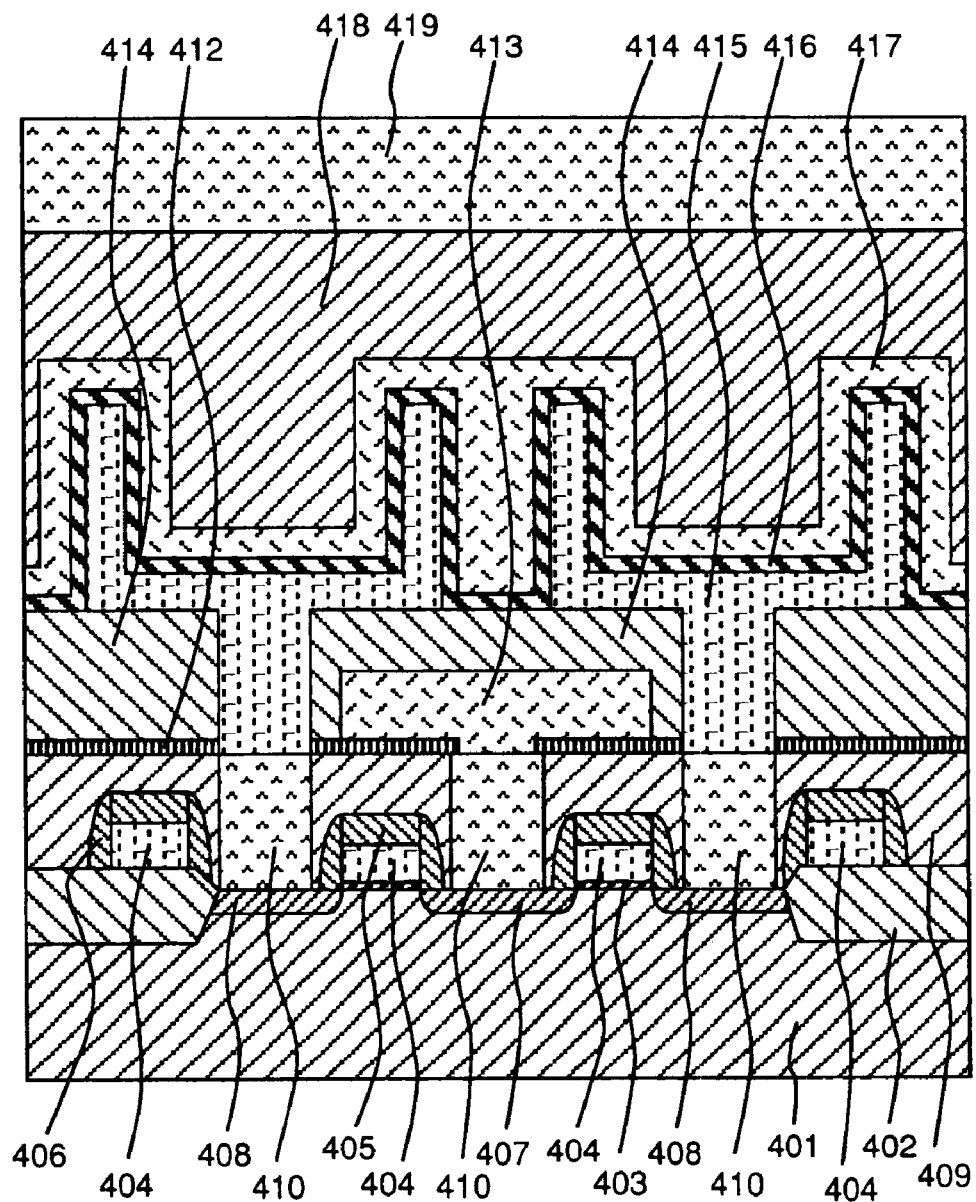
FIG. 43 is a sectional view of the semiconductor memory device based on the idea of the present invention prior to the present invention.

A ninth embodiment of the present invention relates to a memory cell of another system in the static RAM according to the present invention. FIGS. 41 and 42 are plan views of the memory cell of the static RAM according to the ninth embodiment. FIG. 41 shows MISFETs and FIG. 42 shows wiring electrodes. In FIG. 41, for the cross connection of the flip-flop circuit, plug electrodes 318, 319, 320, 321 and 322 are used for connections without using local wirings. Those plug electrodes are made of titanium nitride, and formed by the same method as in the first embodiment. The wiring electrodes are made of two layers of aluminum as in the seventh embodiment.

According to the seventh embodiment, the manufacturing process of the static RAM can be simplified.

In the embodiments of the memory cell described above, both in a static RAM and a dynamic RAM, the indirect peripheral circuit uses plug electrodes of a common self-aligned structure explained in the first embodiment, so that the required area of the indirect peripheral circuit can be reduced.

In the embodiments described above, the present invention is applied to those semiconductor devices in which a static RAM and a dynamic RAM coexist on the same silicon substrate or other semiconductor devices in which memory devices and logic circuits exist side-by-side. Therefore, production cost can be reduced, data transfer rate can be increased, and chip area can be decreased.

As has been described, according to the present invention, it becomes possible to reduce the required area for CMIS-FETs not only in the memory cells but also in the indirect peripheral circuits. In a memory cell of a multilayered structure in which a device is formed above a MISFET, when the memory cell undergoes a hot working process necessary for its formation, the electrical characteristics of the connections between the plug electrodes and the silicon substrate are not impaired. Thus, the memory cells are provided with stable characteristics.

Further, the short margin between the element located at a higher position and a wiring layer at a middle position of the MISFET can be increased. Therefore, it becomes possible to provide a semiconductor device with a smaller chip area.

According to the present invention, it is possible to provide a semiconductor memory device capable of much higher-speed operations by the use of a low resistivity metal, such as copper, for the wiring layer above the capacitor in the memory cell region and for the wiring layer in the indirect peripheral circuit region.

INDUSTRIAL APPLICABILITY

In the embodiments described above, the present invention has been applied to the dynamic RAM and the static RAM.

However, the present invention can be applied to semiconductor integrated circuit devices, such as an on-chip LSI in which memory and logic (logic circuits) exist commingled. In this case, a wiring layer of the logic portion can be formed at a height where there is a capacitor. The logic portion comprises a plurality of CMISFETs. In other words, the logic portion is formed by COS logic.

What is claimed is:

1. A semiconductor memory device comprising:
   a memory cell region, including a first transistor provided on a principal surface of a semiconductor substrate; and
   a logic circuit region, including second and third transistors of mutually different conductivity types,
   wherein on a principal surface of a first insulating film above said first, second and third transistors, a first wiring made of a first metal is formed in a memory cell region and a logic circuit region, and wherein said first wiring is connected to said first, second and third transistors through a connecting body, including first conductors provided in openings passing through said first insulating film, wherein a second insulating film is formed above said first insulating film, said second insulating film having a second opening formed therein;

a side wall is formed on a wall defining said second opening in said second insulating film; and said first wiring is buried in said second opening with said side wall and connected to said first conductor.

2. A semiconductor memory device according to claim 1, wherein said semiconductor substrate is made of silicon, and wherein the properties of said first conductor and first metal are such that said first conductor does not increase contact resistance by reaction with said silicon and that said first conductor is lower in etching rate than the first metal.

3. A semiconductor memory device according to claim 1, wherein said first conductor and said first metal are respectively different refractory metals.

4. A semiconductor memory device according to claim 1, wherein said first conductor and said first metal are selected from titanium nitride, titanium-tungsten or tungsten.

5. A semiconductor memory device according to claim 1, wherein said first conductor is connected through a silicide layer to said silicon substrate.

6. A semiconductor memory device according to claim 1, wherein at least one of a source region or a drain region of said first, second and third transistors is connected through a connecting body including said first conductor to said first metal.

7. A semiconductor memory device according to claim 1, wherein a width of said first wiring is smaller than an average diameter of said first conductor at the opening passing through said first insulating film.

8. A semiconductor integrated circuit device comprising:

a transistor having a gate electrode and source/drain regions formed on opposite sides of said gate electrode;

a first insulating film formed on said transistor, said first insulating film being flattened;

a first conductor connected to one of said source/drain regions through a first opening formed in said first insulating film;

a second insulating film formed above said first insulating film and having a second opening formed therein, said second insulating film being flattened;

a side wall formed on a wall defining said opening in said second insulating film; and a connection conductor including a second conductor buried in said second opening with said side wall and connected to said first conductor.

9. A semiconductor integrated circuit device according to claim 8, wherein said side wall determines a line width for said semiconductor integrated circuit device.

10. A semiconductor integrated circuit device according to claim 8, wherein said connection conductor is made of a refractory metal.

11. A semiconductor integrated circuit device according to claim 8, wherein said connection conductor in said second opening, as viewed in cross-section taken on a plane parallel with a thickness-wise direction of said second insulating film, has a shape such that a first side connected to the first conductor is shorter than a second side opposite to said first side.

12. A semiconductor integrated circuit device according to claim 8, further comprising a third insulating film formed between said first and second insulating films, said second opening passing through said third insulating film so that said first conductor is exposed to said connection conductor.

13. A semiconductor integrated circuit device according to claim 8, wherein a surface of said second conductor not contacting said first conductor is at a level nearer to said first insulating film than a first surface of said second insulating film, said first surface of said second insulating film being farther from said first insulating film than a second surface of said second insulting film opposite to said first surface of said second insulating film.

14. A method of manufacturing a semiconductor integrated circuit device, comprising the steps of:

forming a MISFET having impurity introduced regions in a semiconductor substrate;

forming a first insulating film on a resulting structure, said first insulating film being flattened;

forming first conductors each passing through said first insulating film and being connected to a different one of said impurity introduced regions of said MISFET;

forming a second insulating film above said first insulating film and above said first conductors, said second insulting film being flattened;

forming first openings in said second insulating film;

forming side walls of a third insulating film on walls defining said first openings in said second insulating film, said first conductors being exposed by said first openings with said side walls;

forming a second conductor in said first opening with said side wall and flattening said second conductor and said second insulating film, said second conductor being connected to a first one of said first conductors; and forming a fourth insulating film on said second insulating film and on said second conductor.

15. A method according to claim 14, further comprising the step of forming a second opening passing through said second and fourth insulating films and forming a third conductor in said second opening, said third conductor being connected to, a second one of said first conductors.

16. A method according to claim 14, further comprising the step of forming a fifth insulating film on said first insulating film so that said second insulating film is formed on said fifth insulating film, wherein said fifth insulating film is partly removed at said side wall forming step so that said first conductors are exposed by said first openings with said side walls and said second conductor is formed in said first opening for connection to said first one of said first conductors.

17. A method according to claim 14, wherein, in said step of forming the second conductor and flattening the second conductor and the second insulating film, said second conductor and said second insulating film are formed in such a manner that an upper surface of said second conductor is at a level nearer to said first insulating film than an upper surface of said second insulating film.

* * * * *